(12) United States Patent
Click et al.

(10) Patent No.: US 11,352,291 B2
(45) Date of Patent: Jun. 7, 2022

(54) BLACK BETA-SPODUMENE LITHIUM SILICATE GLASS CERAMICS

(71) Applicant: CORNING INCORPORATED, Corning, NY (US)

(72) Inventors: Carol Ann Click, Corning, NY (US); Qiang Fu, Painted Post, NY (US); Mathieu Gerard Jacques Hubert, Corning, NY (US); Charlene Marie Smith, Corning, NY (US); Alana Marie Whittier, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 42 days.

(21) Appl. No.: 16/692,250

(22) Filed: Nov. 22, 2019

(65) Prior Publication Data

US 2020/0172431 A1   Jun. 4, 2020

Related U.S. Application Data

(60) Provisional application No. 62/773,590, filed on Nov. 30, 2018.

(51) Int. Cl.
| | | |
|---|---|---|
| *C03C 10/00* | (2006.01) | |
| *C03B 32/02* | (2006.01) | |
| *C03C 3/097* | (2006.01) | |
| *C03C 4/02* | (2006.01) | |
| *C03C 4/18* | (2006.01) | |
| *C03C 21/00* | (2006.01) | |
| *H05K 5/00* | (2006.01) | |
| *H05K 5/03* | (2006.01) | |

(52) U.S. Cl.
CPC .......... *C03C 10/0027* (2013.01); *C03B 32/02* (2013.01); *C03C 3/097* (2013.01); *C03C 4/02* (2013.01); *C03C 4/18* (2013.01); *C03C 21/002* (2013.01); *H05K 5/0017* (2013.01); *H05K 5/03* (2013.01); *C03C 2204/00* (2013.01)

(58) Field of Classification Search
CPC ....... C03C 10/0027; C03C 3/097; C03C 4/02; C03C 4/18; C03C 21/002; C03C 2204/00; C03B 32/02; H05K 5/0017; H05K 5/03
See application file for complete search history.

(56) References Cited

U.S. PATENT DOCUMENTS

| | | |
|---|---|---|
| 5,070,044 A | 12/1991 | Pinckney |
| 5,173,453 A | 12/1992 | Beall et al. |

(Continued)

FOREIGN PATENT DOCUMENTS

| | | |
|---|---|---|
| CN | 107902909 A | 4/2018 |
| EP | 0711737 A1 | 5/1996 |

(Continued)

OTHER PUBLICATIONS

Beall et al.; "Nanophase Glass-Ceramics"; J Am Ceram Soc, 1999, 82: 5-16.

(Continued)

*Primary Examiner* — Noah S Wiese

(57) ABSTRACT

A black β-spodumene lithium disilicate glass ceramic is provided. The glass ceramic includes at least one of magnetite, β-quartz, cristobalite, and lithium phosphate as a minor crystal phase. The glass ceramic is characterized by the color coordinates: L*: 15.0 to 35.0, a*: −3.0 to 3.0, and b*: −5.0 to 5.0. The glass ceramic may be ion exchanged. Methods for producing the glass ceramic are also provided.

18 Claims, 16 Drawing Sheets

(56) References Cited

U.S. PATENT DOCUMENTS

| | | | |
|---|---|---|---|
| 5,512,520 | A | 4/1996 | Pfitzenmaier |
| 5,691,256 | A | 11/1997 | Taguchi et al. |
| 7,476,633 | B2 | 1/2009 | Comte et al. |
| 8,091,961 | B2 | 1/2012 | Dryburgh |
| 8,664,130 | B2 | 3/2014 | Beall et al. |
| 9,701,573 | B2 | 7/2017 | Beall et al. |
| 9,790,125 | B2 | 10/2017 | Beall et al. |
| 2005/0016521 | A1 | 1/2005 | Witzmann et al. |
| 2016/0102010 | A1 | 4/2016 | Beall et al. |
| 2016/0102011 | A1 | 4/2016 | Hu et al. |
| 2017/0197384 | A1* | 7/2017 | Finkeldey ......... B32B 17/10036 |
| 2017/0205541 | A1* | 7/2017 | Amin ..................... G02B 1/18 |
| 2017/0334767 | A1* | 11/2017 | Beall ..................... C03C 21/002 |
| 2019/0300426 | A1 | 10/2019 | Fu et al. |

FOREIGN PATENT DOCUMENTS

| | | |
|---|---|---|
| WO | 2009/013445 A1 | 1/2009 |
| WO | 2019108823 A1 | 6/2019 |

OTHER PUBLICATIONS

Bubsey et al; "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (Oct. 1992).

Dejneka et al.; "Chemically Strengthened Low Crystallinity Black Glass-Ceramics With High Liquidus Viscosity"; Int J Appl Glass Sci, 2014, 5:146-160.

Hummel; "Thermal Expansion Properties of Some Synthetic Lithia Minerals"; J Am Ceram Soc, 1951, 34: 235-239.

Laczka et al; "Glass-Ceramics of LAS ($Li_2O$—$Al_2O_3$—$SiO_2$) System Enhanced By Ion-Exchange in $KNO_3$ Salt Bath," J Non-Cryst Solids, 2015, 428: 90-97.

Reddy et al.; "Fracture Toughness Measurement of Glass and Ceramic Materials Using Chevron-Notched Specimens," J. Am. Ceram. Soc., 71 [6], C-310-C-313 (1988).

Shelby; "Introduction to Glass Science and Technology: Second Edition," The Royal Society of Chemistry, 2005; pp. 209-211.

Tagantsev; "Decrystallization of Glass-Ceramics Under Ion Exchange Diffusion," J Eu Deram Soc, 1999, 19:1555-1558.

Varshneya; "Fundamentals of Inorganic Glasses"; Academic Press Inc., San Diego, CA 1994 pp. 463-473.

International Search Report and Written Opinion of the European International Searching Authority; PCT/US2019/062521; dated Feb. 28, 2020; 12 Pgs.

* cited by examiner

BLACK BETA-SPODUMENE LITHIUM SILICATE GLASS CERAMICS

CROSS-REFERENCE TO RELATED APPLICATIONS

This application claims the benefit of priority of U.S. Provisional Application Ser. No. 62/773,590 filed on Nov. 30, 2018, the content of which is relied upon and incorporated herein by reference in its entirety.

BACKGROUND

Field

The present specification generally relates to glass ceramic compositions. More specifically, the present specification is directed to black β-spodumene lithium silicate glass ceramics that may be formed into housings for electronic devices.

Technical Background

Portable electronic devices, such as, smartphones, tablets, and wearable devices (such as, for example, watches and fitness trackers) continue to get smaller and more complex. As such, materials that are conventionally used on at least one external surface of such portable electronic devices also continue to get more complex. For instance, as portable electronic devices get smaller and thinner to meet consumer demand, the housings used in these portable electronic devices also get smaller and thinner, resulting in higher performance requirements for the materials used to form these components.

Accordingly, a need exists for materials that exhibit higher performance, such as resistance to damage, and a pleasing appearance for use in portable electronic devices.

SUMMARY

According to aspect (1), a glass ceramic is provided. The glass ceramic comprises: a first primary crystal phase comprising lithium disilicate; a second primary crystal phase comprising β-spodumene; and at least one of magnetite, β-quartz, cristobalite, and lithium phosphate as a minor crystal phase, wherein the glass ceramic is characterized by the following color coordinates: L*: 15.0 to 35.0; a*: −3.0 to 3.0; and b*: −5.0 to 5.0.

According to aspect (2), the glass ceramic of aspect (1) is provided, wherein the minor crystal phase comprises magnetite and β-quartz.

According to aspect (3), the glass ceramic of aspect (1) or (2) is provided, wherein the glass ceramic has a fracture toughness of greater than or equal to 0.9 MPa·m$^{0.5}$ to less than or equal to 2.0 MPa·m$^{0.5}$.

According to aspect (4), the glass ceramic of any one of aspects (1) to (3) is provided, wherein the glass ceramic has a fracture toughness of greater than or equal to 1.0 MPa·m$^{0.5}$ to less than or equal to 1.5 MPa·m$^{0.5}$.

According to aspect (5), the glass ceramic of any one of aspects (1) to (4) is provided, wherein the center of the glass ceramic article comprises: 55.0 wt % to 75.0 wt % $SiO_2$; 2.0 wt % to 20.0 wt % $Al_2O_3$; 5.0 wt % to 20.0 wt % $Li_2O$; greater than 0 wt % to 5.0 wt % $Na_2O$; 0.5 wt % to 5.0 wt % $TiO_2$; 1.0 wt % to 6.0 wt % $P_2O_5$; 0.5 wt % to 10.0 wt % $ZrO_2$; 0.05 wt % to 0.5 wt % $SnO+SnO_2$; and 0.1 wt % to 5.0 wt % $FeO+Fe_2O_3$.

According to aspect (6), the glass ceramic of any one of aspects (1) to (5) is provided, wherein the center of the glass ceramic article comprises: 55.0 wt % to 75.0 wt % $SiO_2$; 2.0 wt % to 20.0 wt % $Al_2O_3$; 0 wt % to 5.0 wt % $B_2O_3$; 5.0 wt % to 20.0 wt % $Li_2O$; 0 wt % to 5.0 wt % $Na_2O$; 0 wt % to 4.0 wt % $K_2O$; 0 wt % to 8.0 wt % MgO; 0 wt % to 10.0 wt % ZnO; 0.5 wt % to 5.0 wt % $TiO_2$; 1.0 wt % to 6.0 wt % $P_2O_5$; 0.5 wt % to 10.0 wt % $ZrO_2$; 0 wt % to 0.4 wt % $CeO_2$; 0.05 wt % to 0.5 wt % $SnO+SnO_2$; 0.1 wt % to 5.0 wt % $FeO+Fe_2O_3$; 0.1 wt % to 5.0 wt % NiO; 0.1 wt % to 5.0 wt % $Co_3O_4$; 0 wt % to 4.0 wt % $MnO+MnO_2+Mn_2O_3$; 0 wt % to 2.0 wt % $Cr_2O_3$; 0 wt % to 2.0 wt % CuO; and 0 wt % to 2.0 wt % $V_2O_5$.

According to aspect (7), the glass ceramic of any one of aspects (1) to (6) is provided, wherein the glass ceramic has a crystallinity of greater than 50 wt %.

According to aspect (8), the glass ceramic of any one of aspects (1) to (7) is provided, wherein the glass ceramic is ion exchanged and comprises a compressive stress layer extending from a surface of the glass ceramic to a depth of compression.

According to aspect (9), the glass ceramic of aspect (8) is provided, wherein the depth of compression is at least 0.05t, where t is a thickness of glass ceramic.

According to aspect (10), the glass ceramic of aspect (8) or (9) is provided, wherein the depth of compression is at least 40 μm.

According to aspect (11), a consumer electronic product is provided. The consumer electronic product comprises: a housing comprising a front surface, a back surface and side surfaces; electrical components at least partially within the housing, the electrical components comprising at least a controller, a memory, and a display, the display at or adjacent the front surface of the housing; and a cover glass disposed over the display, wherein at least a portion of the housing comprises the glass ceramic of any one of aspects (1) to (7).

According to aspect (12), a consumer electronic product is provided. The consumer electronic product comprises: a housing comprising a front surface, a back surface and side surfaces; electrical components at least partially within the housing, the electrical components comprising at least a controller, a memory, and a display, the display at or adjacent the front surface of the housing; and a cover glass disposed over the display, wherein at least a portion of the housing comprises the glass ceramic of any one of aspects (8) to (10).

According to aspect (13), a method is provided. The method comprises: ceramming a precursor glass-based article to form a glass ceramic, wherein the glass ceramic comprises: a first primary crystal phase comprising lithium disilicate; a second primary crystal phase comprising β-spodumene; and at least one of magnetite, β-quartz, cristobalite, and lithium phosphate as a minor crystal phase, and the glass ceramic is characterized by the following color coordinates: L*: 15.0 to 35.0; a*: −3.0 to 3.0; and b*: −5.0 to 5.0.

According to aspect (14), the method of aspect (13) is provided, wherein the ceramming occurs at a temperature of greater than or equal to 500° C. to less than or equal to 900° C.

According to aspect (15), the method of aspect (13) or (14) is provided, wherein the ceramming occurs for a period of greater than or equal to 4 hours to less than or equal to 16 hours.

According to aspect (16), the method of any one of aspects (13) to (15) is provided, further comprising ion exchanging the glass ceramic.

According to aspect (17), the method of any one of aspects (13) to (16) is provided, wherein the precursor glass-based article comprises: 55.0 wt % to 75.0 wt % $SiO_2$; 2.0 wt % to 20.0 wt % $Al_2O_3$; 5.0 wt % to 20.0 wt % $Li_2O$; greater than 0 wt % to 5.0 wt % $Na_2O$; 0.5 wt % to 5.0 wt % $TiO_2$; 1.0 wt % to 6.0 wt % $P_2O_5$; 0.5 wt % to 10.0 wt % $ZrO_2$; 0.05 wt % to 0.5 wt % $SnO+SnO_2$; and 0.1 wt % to 5.0 wt % $FeO+Fe_2O_3$.

According to aspect (18), the method of any one of aspects (13) to (17) is provided, wherein the precursor glass-based article comprises: 55.0 wt % to 75.0 wt % $SiO_2$; 2.0 wt % to 20.0 wt % $Al_2O_3$; 0 wt % to 5.0 wt % $B_2O_3$; 5.0 wt % to 20.0 wt % $Li_2O$; 0 wt % to 5.0 wt % $Na_2O$; 0 wt % to 4.0 wt % $K_2O$; 0 wt % to 8.0 wt % $MgO$; 0 wt % to 10.0 wt % $ZnO$; 0.5 wt % to 5.0 wt % $TiO_2$; 1.0 wt % to 6.0 wt % $P_2O_5$; 0.5 wt % to 10.0 wt % $ZrO_2$; 0 wt % to 0.4 wt % $CeO_2$; 0.05 wt % to 0.5 wt % $SnO+SnO_2$; 0.1 wt % to 5.0 wt % $FeO+Fe_2O_3$; 0.1 wt % to 5.0 wt % $NiO$; 0.1 wt % to 5.0 wt % $Co_3O_4$; 0 wt % to 4.0 wt % $MnO+MnO_2+Mn_2O_3$; 0 wt % to 2.0 wt % $Cr_2O_3$; 0 wt % to 2.0 wt % $CuO$; and 0 wt % to 2.0 wt % $V_2O_5$.

According to aspect (19), a glass is provided. The glass comprises: 55.0 wt % to 75.0 wt % $SiO_2$; 2.0 wt % to 20.0 wt % $Al_2O_3$; 5.0 wt % to 20.0 wt % $Li_2O$; greater than 0 wt % to 5.0 wt % $Na_2O$; 0.5 wt % to 5.0 wt % $TiO_2$; 1.0 wt % to 6.0 wt % $P_2O_5$; 0.5 wt % to 10.0 wt % $ZrO_2$; 0.05 wt % to 0.5 wt % $SnO+SnO_2$; and 0.1 wt % to 5.0 wt % $FeO+Fe_2O_3$.

According to aspect (20), the glass of aspect (19) is provided, further comprising: 0 wt % to 5.0 wt % $B_2O_3$; 0 wt % to 4.0 wt % $K_2O$; 0 wt % to 8.0 wt % $MgO$; 0 wt % to 10.0 wt % $ZnO$; 0 wt % to 0.4 wt % $CeO_2$; 0 wt % to 5.0 wt % $NiO$; 0 wt % to 5.0 wt % $Co_3O_4$; 0 wt % to 4.0 wt % $MnO+MnO_2+Mn_2O_3$; 0 wt % to 2.0 wt % $Cr_2O_3$; 0 wt % to 2.0 wt % $CuO$; and 0 wt % to 2.0 wt % $V_2O_5$.

According to aspect (21), the glass of aspect (19) or (20) is provided, further comprising at least one of: 0.1 wt % to 5.0 wt % $NiO$; and 0.1 wt % to 5.0 wt % $Co_3O_4$.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments and are incorporated into and constitute a part of this specification. The drawings illustrate the various embodiments described herein and, together with the description, serve to explain the principles and operations of the claimed subject matter.

DETAILED DESCRIPTION

Figure 1:
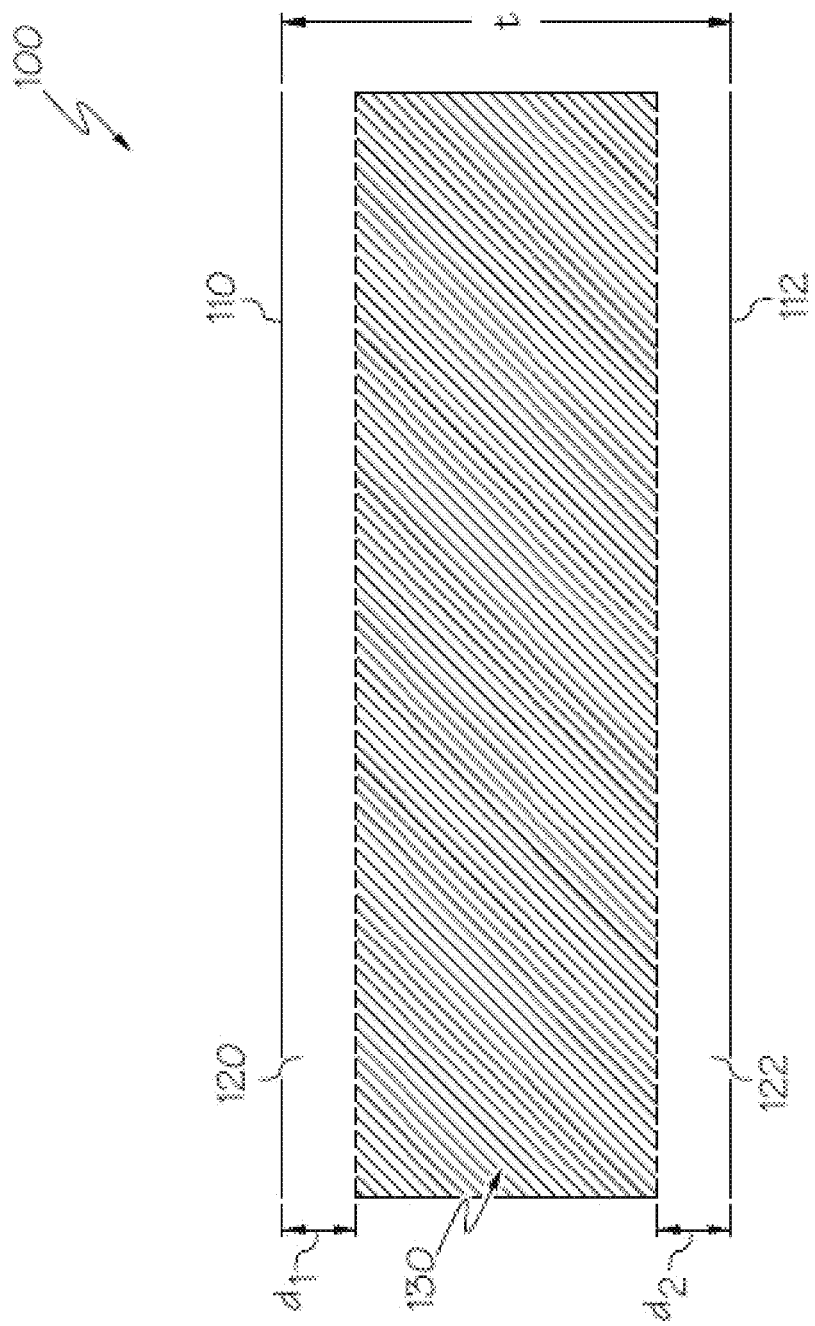
FIG. 1 schematically depicts a cross section of a glass ceramic having compressive stress layers on surfaces thereof according to embodiments disclosed and described herein.

Reference will now be made in detail to black β-spodumene lithium silicate glass ceramics according to various embodiments. In particular, the black β-spodumene lithium silicate glass ceramics have a pleasing appearance, and exhibit high strength and fracture toughness. Therefore, the black β-spodumene lithium silicate glass ceramics are suited for use as housings in portable electronic devices.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. Whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range as well as any ranges therebetween. As used herein, the indefinite articles "a," "an," and the corresponding definite article "the" mean "at least one" or "one or more," unless otherwise specified. It also is understood that the various features disclosed in the specification and the drawings can be used in any and all combinations.

Unless otherwise specified, all compositions of the glasses described herein are expressed in terms of weight percent (wt %), and the constituents are provided on an oxide basis. Unless otherwise specified, all temperatures are expressed in terms of degrees Celsius (° C.).

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. For example, a glass that is "substantially free of $K_2O$" is one in which $K_2O$ is not actively added or batched into the glass, but may be present in very small amounts as a contaminant, such as in amounts of less than about 0.01 wt %. As utilized herein, when the term "about" is used to modify a value, the exact value is also disclosed.

The glass ceramics contain a first primary crystal phase, a second primary crystal phase, a minor crystal phase, and a residual glass phase. The first and second primary crystal phases are present, independently, as a larger fraction of the glass ceramic by weight than the minor crystal phase. Accordingly, the minor crystal phase is present in a concentration in terms of weight percent of the glass ceramic that is less than the weight percent of either of the first and second primary crystal phases.

In embodiments, the first primary crystal phase includes lithium disilicate and the second primary crystal phase includes β-spodumene. As utilized herein, β-spodumene may refer to β-spodumene solid solutions. Without wishing to be bound by any particular theory, the lithium disilicate crystals of the glass ceramic may interlock to produce an enhanced body strength and fracture toughness.

In some embodiments, the glass ceramic includes a minor crystal phase including at least one of magnetite, β-quartz, cristobalite, and lithium phosphate. In embodiments, the glass ceramic contains more than one minor crystal phase. In some embodiments, additional crystal phases may be present in the glass ceramic.

In embodiments, the total crystallinity of the glass ceramic is high enough to provide enhanced mechanical properties, such as hardness, Young's modulus, and scratch resistance. As utilized herein, the total crystallinity is provided in wt % and refers to the sum of the wt % of all the crystal phases present in the glass ceramic relative to the total weight of the measured sample. In embodiments, the total crystallinity is greater than or equal to about 50 wt %, such as greater than or equal to about 55 wt %, greater than or equal to about 60 wt %, greater than or equal to about 65 wt %, greater than or equal to about 70 wt %, greater than or equal to about 75 wt %, or more. It should be understood that, in embodiments, any of the above ranges may be combined with any other range. In embodiments, the total crystallinity of the glass ceramic is from greater than or equal to about 50 wt % to less than or equal to about 75 wt %, such as greater than or equal to about 55 wt % to less than or equal to about 70 wt %, or greater than or equal to about 60 wt % to less than or equal to about 65 wt %, and all ranges and sub-ranges between the foregoing values. The total crystallinity of the glass ceramic is determined through Rietveld quantitative analysis of X-ray diffraction (XRD) results.

The glass ceramics are opaque or translucent. In embodiments, the glass ceramics exhibit a transmittance of less than about 10% in the visible range (380 nm to 760 nm), such as less than about 9%, less than about 8%, less than about 7%, less than about 6%, less than about 5%, less than about 4%, less than about 3%, less than about 2%, less than about 1%, or less. The transmittance as utilized herein refers to total transmittance, and is measured using a Perkin Elmer Lambda 950 UV/Vis/NIR spectrophotometer with a 150 mm integrating sphere. The samples are mounted at the sphere's entrance port, which allows for the collection of wide angle scattered light, and a reference Spectralon reflectance disc is located over the sphere's exit port. The total transmittance is generated relative to an open beam baseline measurement. It should be understood that the thickness of the glass ceramic may impact the transmittance. For example thicker glass ceramics may exhibit lower transmittances.

In embodiments, the glass ceramics are black. The glass ceramics may be characterized by the following color coordinates: L* 15.0 to 35.0, a* −3.0 to 3.0, and b* −5.0 to 5.0. In some embodiments, the L* value of the glass ceramic may be from 15.0 to 35.0, such as from 16.0 to 34.0, from 17.0 to 33.0, from 18.0 to 32.0, from 19.0 to 31.0, from 20.0 to 30.0, from 26.0 to 29.0, from 27.0 to 28.0, and all ranges and sub-ranges between the foregoing values. In some embodiments, the a* value of the glass ceramic may be from −3.0 to 3.0, such as from −2.8 to 2.8, from −2.6 to 2.6, from −2.4 to 2.4, from −2.2 to 2.2, from −2.0 to 2.0, from −1.8 to 1.8, from −1.6 to 1.6, from −1.4 to 1.4, from −1.2 to 1.2, from −1.0 to 1.0, from −0.8 to 0.8, from −0.6 to 0.6, from −0.4 to 0.4, from −0.2 to 0.2, 0, and all ranges and sub-ranges between the foregoing values. In some embodiments, the b* value of the glass ceramic may be from −5.0 to 5.0, such as from −4.5 to 4.5, from −4.0 to 4.0, from −3.5 to 3.5, from −3.0 to 3.0, from −2.5 to 2.5, from −2.0 to 2.0, from −1.5 to 1.5, from −1.0 to 1.0, from −0.5 to 0.5, 0, and all ranges and sub-ranges between the foregoing values. As utilized herein, the color coordinates are measured using an X-rite Cil F02 illuminant under SCI UVC conditions in reflected mode.

In embodiments, the glass ceramic may have a high fracture toughness. The high fracture toughness is achieved at least in part due to the crystal phase assemblage of the glass ceramic. In some embodiments, the glass ceramic may have a fracture toughness of greater than or equal to about 0.9 MPa·m$^{0.5}$ to less than or equal to about 2.0 MPa·m$^{0.5}$, such as greater than or equal to about 1.0 MPa·m$^{0.5}$ to less than or equal to about 1.9 MPa·m$^{0.5}$, greater than or equal to about 1.1 MPa·m$^{0.5}$ to less than or equal to about 1.8 MPa·m$^{0.5}$, greater than or equal to about 1.2 MPa·m$^{0.5}$ to less than or equal to about 1.7 MPa·m$^{0.5}$, greater than or equal to about 1.3 MPa·m$^{0.5}$ to less than or equal to about 1.6 MPa·m$^{0.5}$, greater than or equal to about 1.4 MPa·m$^{0.5}$ to less than or equal to about 1.5 MPa·m$^{0.5}$, and all ranges and sub-ranges between the foregoing values. In some embodiments, the glass ceramic may have a fracture toughness of greater than or equal to about 1.0 MPa·m$^{0.5}$ to less than or equal to about 1.5 MPa·m$^{0.5}$. The fracture toughness is measured by chevron notched short bar (CNSB) method, as described below.

In embodiments, the glass ceramic may have a high strength. The high strength is achieved at least in part due to the crystal phase assemblage of the glass ceramic. In some embodiments, the glass ceramic has a strength of greater than or equal to about 290 MPa, such as greater than or equal to about 300 MPa, greater than or equal to about 310 MPa, greater than or equal to about 320 MPa, greater than or equal to about 330 MPa, greater than or equal to about 340 MPa, greater than or equal to about 350 MPa, greater than or equal to about 360 MPa, greater than or equal to about 370 MPa, greater than or equal to about 380 MPa, greater than or equal to about 390 MPa, or more. In embodiments, the glass ceramic has a strength of greater than or equal to about 290 MPa to less than or equal to about 400 MPa, such as greater than or equal to about 300 MPa to less than or equal to about 390 MPa, greater than or equal to about 310 MPa to less than or equal to about 380 MPa, greater than or equal to about 320 MPa to less than or equal to about 370 MPa, greater than or equal to about 330 MPa to less than or equal to about 360 MPa, greater than or equal to about 340 MPa to less than or equal to about 350 MPa, and any and all sub-ranges formed from these endpoints. The strength refers to the strength as measured by the ring-on-ring test described below.

The composition of the β-spodumene lithium silicate glass ceramics will now be described. In embodiments of glass ceramics described herein, the concentration of constituent components (e.g., $SiO_2$, $Al_2O_3$, $Li_2O$, $Na_2O$ and the like) are given in weight percent (wt %) on an oxide basis, unless otherwise specified. Components of the glass ceramics according to embodiments are discussed individually below. It should be understood that any of the variously recited ranges of one component may be individually combined with any of the variously recited ranges for any other component.

In embodiments of the glass ceramics disclosed herein, $SiO_2$ is the largest constituent. The $SiO_2$ acts as the primary network former and stabilizes the network structure. The $SiO_2$ is necessary for the formation of the desired β-spodumene and lithium silicate crystal phases. If the $SiO_2$ content is too low it may not be possible to form the desired β-spodumene and lithium silicate crystal phases. Pure $SiO_2$ has a relatively low CTE and is alkali free. However, pure $SiO_2$ has a high melting point. Accordingly, if the concentration of $SiO_2$ in the glass ceramic is too high, the formability of the precursor glass composition used to form the glass ceramics may be diminished as higher concentrations of $SiO_2$ increase the difficulty of melting the glass, which, in turn, adversely impacts the formability of the precursor glass. In embodiments, the glass composition generally comprises $SiO_2$ in an amount greater than or equal to about 55.0 wt %, such as greater than or equal to about 56.0 wt %, greater than or equal to about 57.0 wt %, greater than or equal to about 58.0 wt %, greater than or equal to about 59.0 wt %, greater than or equal to about 60.0 wt %, greater than or equal to about 61.0 wt %, greater than or equal to about 62.0 wt %, greater than or equal to about 63.0 wt %, greater than or equal to about 64.0 wt %, greater than or equal to about 65.0 wt %, greater than or equal to about 66.0 wt %, greater than or equal to about 67.0 wt %, greater than or equal to about 68.0 wt %, greater than or equal to about 69.0 wt %, greater than or equal to about 70.0 wt %, greater than or equal to about 71.0 wt %, greater than or equal to about 72.0 wt %, greater than or equal to about 73.0 wt %, or greater than or equal to about 74.0 wt %. In embodiments, the glass composition comprises $SiO_2$ in amounts less than or equal to about 75.0 wt %, such as less than or equal to about 74.0 wt %, less than or equal to about 73.0 wt %, less than or equal to about 72.0 wt %, or less than or equal to about 71.0 wt %, less than or equal to about 70.0 wt %, less than or equal to about 69.0 wt %, less than or equal to about 68.0 wt %, less than or equal to about 67.0 wt %, less than or equal to about 66.0 wt %, less than or equal to about 65.0 wt %, less than or equal to about 64.0 wt %, less than or equal to about 63.0 wt %, less than or equal to about 62.0 wt %, less than or equal to about 61.0 wt %, less than or equal to about 60.0 wt %, less than or equal to about 59.0 wt %, less than or equal to about 58.0 wt %, less than or equal to about 57.0 wt %, or less than or equal to about 56.0 wt %. It should be understood that, in embodiments, any of the above ranges may be combined with any other range. In embodiments, the glass composition comprises $SiO_2$ in an amount from greater than or equal to about 55.0 wt % to less than or equal to about 75.0 wt %, such as from greater than or equal to about 56.0 wt % to less than or equal to about 74.0 wt %, from greater than or equal to about 57.0 wt % to less than or equal to about 73.0 wt %, from greater than or equal to about 58.0 wt % to less than or equal to about 72.0 wt %, from greater than or equal to about 59.0 wt % to less than or equal to about 71.0 wt %, from greater than or equal to about 60.0 wt % to less than or equal to about 70.0 wt %, from greater than or equal to about 61.0 wt % to less than or equal to about 69.0 wt %, from greater than or equal to about 62.0 wt % to less than or equal to about 68.0 wt %, from greater than or equal to about 63.0 wt % to less than or equal to about 67.0 wt %, from greater than or equal to about 64.0 wt % to less than or equal to about 66.0 wt %, or about 65.0 wt %, and all ranges and sub-ranges between the foregoing values. In some embodiments, the glass ceramic includes $SiO_2$ in an amount from greater than or equal to about 65 wt % to less than or equal to about 75 wt %.

The glass ceramics of also include $Al_2O_3$. The inclusion of $Al_2O_3$ is required for the formation of the β-spodumene crystal phase, but may increase the viscosity of the precursor glass compositions used to form the glass ceramics due to its tetrahedral coordination in a glass melt formed from a glass composition, decreasing the formability of the glass composition when the amount of $Al_2O_3$ is too high. If the $Al_2O_3$ content is too low, the formation of the β-spodumene crystal phase may be difficult, and the chemical durability of the glass ceramic may be reduced. However, when the concentration of $Al_2O_3$ is balanced against the concentration of $SiO_2$ and the concentration of alkali oxides in the glass composition, $Al_2O_3$ can reduce the liquidus temperature of the glass melt, thereby enhancing the liquidus viscosity and improving the compatibility of the glass composition with certain forming processes. If the $Al_2O_3$ content is too high, the amount of lithium disilicate crystals formed in the glass ceramic may be undesirably decreased, preventing the formation of an interlocking structure. Similarly to the $SiO_2$, the $Al_2O_3$ stabilizes the network structure. In embodiments, the glass composition generally comprises $Al_2O_3$ in a concentration of greater than or equal to about 2.0 wt %, such as greater than or equal to about 3.0 wt %, greater than or equal to about 4.0 wt %, greater than or equal to about 5.0 wt %, greater than or equal to about 6.0 wt %, greater than or equal to about 7.0 wt %, greater than or equal to about 8.0 wt %, greater than or equal to about 9.0 wt %, greater than or equal to about 10.0 wt %, greater than or equal to about 11.0 wt %, greater than or equal to about 12.0 wt %, greater than or equal to about 13.0 wt %, greater than or equal to about 14.0 wt %, greater than or equal to about 15.0 wt %, greater than or equal to about 16.0 wt %, greater than or equal to about 17.0 wt %, greater than or equal to about 18.0 wt %, or greater than or equal to about 19.0 wt %. In embodiments, the glass composition comprises $Al_2O_3$ in amounts less than or equal to about 20.0 wt %, such as less than or equal to about 19.0 wt %, less than or equal to about 18.0 wt %, less than or equal to about 17.0 wt %, less than or equal to about 16.0 wt %, less than or equal to about 15.0 wt %, less than or equal to about 14.0 wt %, less than or equal to about 13.0 wt %, less than or equal to about 12.0 wt %, less than or equal to about 11.0 wt %, less than or equal to about 10.0 wt %, less than or equal to about 9.0 wt %, less than or equal to about 8.0 wt %, less than or equal to about 7.0 wt %, less than or equal to about 6.0 wt %, less than or equal to about 5.0 wt %, less than or equal to about 4.0 wt %, or less than or equal to about 3.0 wt %. It should be understood that, in embodiments, any of the above ranges may be combined with any other range. In other embodiments, the glass composition comprises $Al_2O_3$ in an amount from greater than or equal to about 2.0 wt % to less than or equal to about 20.0 wt %, such as from greater than or equal to about 3.0 wt % to less than or equal to about 19.0 wt %, from greater than or equal to about 4.0 wt % to less than or equal to about 18.0 wt %, from greater than or equal to about 5.0 wt % to less than or equal to about 17.0 wt %, from greater than or equal to about 6.0 wt % to less than or equal to about 16.0 wt %, from greater than or equal to about 7.0 wt % to less than or equal to about 15.0 wt %, from greater than or equal to about 8.0 wt % to less than or equal to about 14.0 wt %, from greater than or equal to about 9.0 wt % to less than or equal to about 13.0 wt %, from greater than or equal to about 10.0 wt % to less than or equal to about 12.0 wt %, or about 11 wt %, and all ranges and sub-ranges between the foregoing values. In embodiments, the glass composition comprises $Al_2O_3$ in an amount from greater than or equal to about 7.0 wt % to less than or equal to about 11.0 wt %.

The glass ceramics of embodiments may further comprise $B_2O_3$. The inclusion of $B_2O_3$ reduces the melting temperature of the glass composition. Additionally, the existence of $B_2O_3$ in the trigonal coordination state opens up the structure of the glass composition, allowing the glasses to tolerate some degree of deformation before crack formation occurs. In embodiments, the glass composition contains $B_2O_3$ in an amount greater than or equal to 0 wt %, such as greater than or equal to about 0.5 wt %, greater than or equal to about 1.0 wt %, greater than or equal to about 1.5 wt %, greater than or equal to about 2.0 wt %, greater than or equal to about 2.5 wt %, greater than or equal to about 3.0 wt %, greater than or equal to about 3.5 wt %, greater than or equal to about 4.0 wt %, or greater than or equal to about 4.5 wt %. In embodiments, the glass composition contains $B_2O_3$ in an amount less than or equal to about 5.0 wt %, such as less than or equal to about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the glass composition comprises $B_2O_3$ in an amount from greater than or equal to about 0 wt % to less than or equal to about 5.0 wt %, such as greater than or equal to about 0.5 wt % to less than or equal to about 4.5 wt %, greater than or equal to about 1.0 wt % to less than or equal to about 4.0 wt %, greater than or equal to about 1.5 wt % to less than or equal to about 3.5 wt %, greater than or equal to about 2.0 wt % to less than or equal to about 3.0 wt %, or about 2.5 wt %, and all ranges and sub-ranges between the foregoing values.

The glass ceramics of embodiments further comprise $Li_2O$. The addition of lithium in the glass ceramic allows for an ion exchange process and further reduces the softening point of the precursor glass composition. The $Li_2O$ also provides the lithium necessary for the formation of the β-spodumene and lithium silicate crystal phases when the precursor glass is cerammed to form a glass ceramic. If the $Li_2O$ content is too high, the forming of the precursor glass becomes difficult. In embodiments, the glass composition generally comprises $Li_2O$ in an amount greater than about 5.0 wt %, such as greater than or equal to about 5.5 wt %, greater than or equal to about 6.0 wt %, greater than or equal to about 6.5 wt %, greater than or equal to about 7.0 wt %, greater than or equal to about 7.5 wt %, greater than or equal to about 8.0 wt %, greater than or equal to about 8.5 wt %, greater than or equal to about 9.0 wt %, greater than or equal to about 9.5 wt %, greater than or equal to about 10.0 wt %, greater than or equal to about 10.5 wt %, greater than or equal to about 11.0 wt %, greater than or equal to about 11.5 wt %, greater than or equal to about 12.0 wt %, greater than or equal to about 12.5 wt %, greater than or equal to about 13.0 wt %, greater than or equal to about 13.5 wt %, greater than or equal to about 14.0 wt %, greater than or equal to about 14.5 wt %, greater than or equal to about 15.0 wt %, greater than or equal to about 15.5 wt %, greater than or equal to about 16.0 wt %, greater than or equal to about 16.5 wt %, greater than or equal to about 17.0 wt %, greater than or equal to about 17.5 wt %, greater than or equal to about 18.0 wt %, greater than or equal to about 18.5 wt %, greater than or equal to about 19.0 wt %, or greater than or equal to about 19.5 wt %. In some embodiments, the glass composition comprises $Li_2O$ in amounts less than or equal to about 20.0 wt %, such as less than or equal to about 19.5 wt %, less than or equal to about 19.0 wt %, less than or equal to about 18.5 wt %, less than or equal to about 18.0 wt %, less than or equal to about 17.5 wt %, less than or equal to about 17.0 wt %, less than or equal to about 16.5 wt %, less than or equal to about 16.0 wt %, less than or equal to about 15.5 wt %, less than or equal to about 15.0 wt %, less than or equal to about 14.5 wt %, less than or equal to about 14.0 wt %, less than or equal to about 13.5 wt %, less than or equal to about 13.0 wt %, less than or equal to about 12.5 wt %, less than or equal to about 12.0 wt %, less than or equal to about 11.5 wt %, less than or equal to about 11.0 wt %, less than or equal to about 10.5 wt %, less than or equal to about 10.0 wt %, less than or equal to about 9.5 wt %, less than or equal to about 9.0 wt %, less than or equal to about 8.5 wt %, less than or equal to about 8.0 wt %, less than or equal to about 7.5 wt %, less than or equal to about 7.0 wt %, less than or equal to about 6.5 wt %, less than or equal to about 6.0 wt %, or less than or equal to about 5.5 wt %. It should be understood that, in embodiments, any of the above ranges may be combined with any other range. In embodiments, the glass composition comprises $Li_2O$ in an amount from greater than about 5.0 wt % to less than or equal to about 20.0 wt %, such as from greater than or equal to about 5.5 wt % to less than or equal to about 19.5 wt %, from greater than or equal to about 6.0 wt % to less than or equal to about 19.0 wt %, from greater than or equal to about 6.5 wt % to less than or equal to about 18.5 wt %, from greater than or equal to about 7.0 wt % to less than or equal to about 18.0 wt %, from greater than or equal to about 7.5 wt % to less than or equal to about 17.5 wt %, from greater than or equal to about 8.0 wt % to less than or equal to about 17.0 wt %, from greater than or equal to about 8.5 wt % to less than or equal to about 16.5 wt %, from greater than or equal to about 9.0 wt % to less than or equal to about 16.0 wt %, from greater than or equal to about 9.5 wt % to less than or equal to about 15.5 wt %, from greater than or equal to about 10.0 wt % to less than or equal to about 15.0 wt %, from greater than or equal to about 10.5 wt % to less than or equal to about 14.5 wt %, from greater than or equal to about 11.0 wt % to less than or equal to about 14.0 wt %, from greater than or equal to about 11.5 wt % to less than or equal to about 13.5 wt %, from greater than or equal to about 12.0 wt % to less than or equal to about 13.0 wt %, about 12.5 wt %, and all ranges and sub-ranges between the foregoing values. In some embodiments, the glass composition comprises $Li_2O$ in an amount from greater than or equal to about 6.0 wt % to less than or equal to about 11.0 wt %, from greater than or equal to about 7 wt % to less than or equal to about 20 wt %, or from greater than or equal to about 7 wt % to less than or equal to about 15 wt %.

The glass ceramic may include one or more alkali metal oxides in addition to $Li_2O$. The alkali metal oxides further facilitate the chemical strengthening of the glass ceramic, such as through an ion exchange process. The alkali metal oxides (e.g., $Li_2O$, $Na_2O$, and $K_2O$ as well as other alkali metal oxides including $Cs_2O$ and $Rb_2O$) in the glass ceramic may be referred to as "$R_2O$", and the content of $R_2O$ may be expressed in wt %. In some embodiments, the glass ceramic may include a mixture of alkali metal oxides, such as a combination of $Li_2O$ and $Na_2O$, a combination of $Li_2O$ and $K_2O$, or a combination of $Li_2O$, $Na_2O$, and $K_2O$. The inclusion of a mixture of alkali metal oxides in the glass ceramic may result in faster and more efficient ion exchange.

The glass ceramic may include $Na_2O$ as an additional alkali metal oxide. The $Na_2O$ aids in the ion exchangeability of the glass ceramic, and also decreases the melting point of the precursor glass composition and improves formability of the precursor glass composition. The presence of $Na_2O$ also shortens the length of the necessary ceramming treatment. However, if too much $Na_2O$ is added to the glass composition, the CTE may be too high. The $Na_2O$ may also reduce the viscosity of the residual glass in the glass ceramic, which may reduce the cracks formed in the glass ceramics during the ceramming treatment. In embodiments, the glass composition generally comprises $Na_2O$ in an amount greater than or equal to 0.0 wt %, such as greater than or equal to about 0.5 wt %, greater than or equal to about 1.0 wt %, greater than or equal to about 1.5 wt %, greater than or equal to about 2.0 wt %, greater than or equal to about 2.5 wt %, greater than or equal to about 3.0 wt %, greater than or equal to about 3.5 wt %, greater than or equal to about 4.0 wt %, or greater than or equal to about 4.5 wt %. In some embodiments, the glass composition comprises $Na_2O$ in amounts less than or equal to about 5.0 wt %, such as less than or equal to about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the glass composition comprises $Na_2O$ in an amount from greater than or equal to 0.0 wt % to less than or equal to about 5.0 wt %, such as from greater than or equal to about 0.5 wt % to less than or equal to about 4.5 wt %, from greater than or equal to about 1.0 wt % to less than or equal to about 4.0 wt %, from greater than or equal to about 1.5 wt % to less than or equal to about 3.5 wt %, from greater than or equal to about 2.0 wt % to less than or equal to about 3.0 wt %, or about 2.5 wt %, and all ranges and sub-ranges between the foregoing values.

The glass ceramic may include $K_2O$ as an additional alkali metal oxide. The $K_2O$ may aid in the ion exchangeability of the glass ceramic. In embodiments, the glass composition generally comprises $K_2O$ in an amount greater than or equal to 0.0 wt %, such as greater than or equal to about 0.5 wt %, greater than or equal to about 1.0 wt %, greater than or equal to about 1.5 wt %, greater than or equal to about 2.0 wt %, greater than or equal to about 2.5 wt %, greater than or equal to about 3.0 wt %, or greater than or equal to about 3.5 wt %. In some embodiments, the glass composition comprises $K_2O$ in amounts less than or equal to about 4.0 wt %, such as less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the glass composition comprises $K_2O$ in an amount from greater than or equal to 0.0 wt % to less than or equal to about 4.0 wt %, such as from greater than or equal to about 0.5 wt % to less than or equal to about 3.5 wt %, from greater than or equal to about 1.0 wt % to less than or equal to 3.0 wt %, from greater than or equal to about 1.5 wt % to less than or equal to about 2.5 wt %, or about 2.0 wt %, and all ranges and sub-ranges between the foregoing values.

In embodiments, the glass ceramic may include $P_2O_5$. The $P_2O_5$ acts as a nucleating agent to produce bulk nucleation. If the concentration of $P_2O_5$ is too low, the precursor glass may not crystallize or may undergo undesired surface crystallization. If the concentration of $P_2O_5$ is too high, devitrification of the precursor glass upon cooling during forming may be difficult to control. The presence of $P_2O_5$ in the glass ceramic may also increase the diffusivity of metal ions in the glass ceramic, which may increase the efficiency of ion exchanging the glass ceramic. In embodiments, the amount of $P_2O_5$ in the glass ceramic may be greater than or equal to about 1.0 wt %, such as greater than or equal to about 1.5 wt %, greater than or equal to about 2.0 wt %, greater than or equal to about 2.5 wt %, greater than or equal to about 3.0 wt %, greater than or equal to about 3.5 wt %, greater than or equal to about 4.0 wt %, greater than or equal to about 4.5 wt %, greater than or equal to about 5.0 wt %, or greater than or equal to about 5.5 wt %. In embodiments, the amount of $P_2O_5$ in the glass ceramic may be less than or equal to about 6.0 wt %, such as less than or equal to about 5.5 wt %, less than or equal to about 5.0 wt %, less than or equal than about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, or less than or equal to about 1.5 wt %. It should be understood that, in embodiments, any of the above ranges may be combined with any other range. In embodiments, the glass composition comprises $P_2O_5$ in an amount from greater than or equal to about 1.0 wt % to less than or equal to about 6.0 wt %, such as from greater than or equal to about 1.5 wt % to less than or equal to about 5.5 wt %, from greater than or equal to about 2.0 wt % to less than or equal to about 5.0 wt %, from greater than or equal to about 2.5 wt % to less than or equal to about 4.5 wt %, from greater than or equal to about 3.0 wt % to less than or equal to about 4.0 wt %, or about 4.0 wt %, and all ranges and sub-ranges between the foregoing values.

In embodiments, the glass ceramic may include $ZrO_2$. The $ZrO_2$ acts as a network former or intermediate in the precursor glass compositions. The $ZrO_2$ increases the stability of the glass compositions by reducing the devitrification of the glass composition during forming, and also reduces the liquidus temperature. The addition of $ZrO_2$ also increases the chemical durability of the glass ceramics, and increases the elastic modulus of the residual glass. In embodiments, the amount of $ZrO_2$ in the glass ceramic is greater than or equal to about 0.5 wt %, such as greater than or equal to about 1.0 wt %, greater than or equal to about 1.5 wt %, greater than or equal to about 2.0 wt %, greater than or equal to about 2.5 wt %, greater than or equal to about 3.0 wt %, greater than or equal to about 3.5 wt %, greater than or equal to about 4.0 wt %, greater than or equal to about 4.5 wt %, greater than or equal to about 5.0 wt %, greater than or equal to about 5.5 wt %, greater than or equal to about 6.0 wt %, greater than or equal to about 6.5 wt %, greater than or equal to about 7.0 wt %, greater than or equal to about 7.5 wt %, greater than or equal to about 8.0 wt %, greater than or equal to about 8.5 wt %, greater than or equal to about 9.0 wt %, or greater than or equal to about 9.5 wt %. In embodiments, the amount of $ZrO_2$ in the glass ceramic is less than or equal to about 10.0 wt %, such as less than or equal to about 9.5 wt %, less than or equal to about 9.0 wt %, less than or equal to about 8.5 wt %, less than or equal to about 8.0 wt %, less than or equal to about 7.5 wt %, less than or equal to about 7.0 wt %, less than or equal to about 6.5 wt %, less than or equal to about 6.0 wt %, less than or equal to about 5.5 wt %, less than or equal to about 5.0 wt %, less than or equal than about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, or less than or equal to about 1.0 wt %. It should be understood that, in embodiments, any of the above ranges may be combined with any other range. In embodiments, the amount of $ZrO_2$ in the glass ceramic is greater than or equal to about 0.5 wt % to less than or equal to about 10.0 wt %, such as greater than or equal to about 1.0 wt % to less than or equal to about 9.5 wt %, greater than or equal to about 1.5 wt % to less than or equal to about 9.0 wt %, greater than or equal to about 2.0 wt % to less than or equal to about 8.5 wt %, greater than or equal to about 2.5 wt % to less than or equal to about 8.0 wt %, greater than or equal to about 3.0 wt % to less than or equal to about 7.5 wt %, greater than or equal to about 3.5 wt % to less than or equal to about 7.0 wt %, greater than or equal to about 4.0 wt % to less than or equal to about 6.5 wt %, greater than or equal to about 4.5 wt % to less than or equal to about 6.0 wt %, or greater than or equal to about 5.0 wt % to less than or equal to about 5.5 wt %, and all ranges and sub-ranges between the foregoing values. In some embodiments, the amount of $ZrO_2$ in the glass ceramic is greater than or equal to about 2.0 wt % to less than or equal to about 4.0 wt %.

The glass ceramics of embodiments may further comprise ZnO. The ZnO also acts as a flux, lowering the cost of the production of the precursor glass. In the glass ceramic, the ZnO may be present in β-spodumene crystals as a partial solid solution. In embodiments, the glass composition generally comprises ZnO in a concentration of greater than or equal to about 0.0 wt %, such as greater than or equal to about 0.5 wt %, greater than or equal to about 1.0 wt %, greater than or equal to about 1.5 wt %, greater than or equal to about 2.0 wt %, greater than or equal to about 2.5 wt %, greater than or equal to about 3.0 wt %, greater than or equal to about 3.5 wt %, greater than or equal to about 4.0 wt %, greater than or equal to about 4.5 wt %, greater than or equal to about 5.0 wt %, greater than or equal to about 5.5 wt %, greater than or equal to about 6.0 wt %, greater than or equal to about 6.5 wt %, greater than or equal to about 7.0 wt %, greater than or equal to about 7.5 wt %, greater than or equal to about 8.0 wt %, greater than or equal to about 8.5 wt %, greater than or equal to about 9.0 wt %, or greater than or equal to about 9.5 wt %. In embodiments, the glass composition comprises ZnO in amounts less than or equal to about 10.0 wt %, such as less than or equal to about 9.5 wt %, less than or equal to about 9.0 wt %, less than or equal to about 8.5 wt %, less than or equal to about 8.0 wt %, less than or equal to about 7.5 wt %, less than or equal to about 7.0 wt %, less than or equal to about 6.5 wt %, less than or equal to about 6.0 wt %, less than or equal to about 5.5 wt %, less than or equal to about 5.0 wt %, less than or equal than about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the glass composition comprises ZnO in an amount from greater than or equal to about 0.0 wt % to less than or equal to about 10.0 wt %, such as from greater than or equal to about 0.5 wt % to less than or equal to about 9.5 wt %, from greater than or equal to about 1.0 wt % to less than or equal to about 9.0 wt %, from greater than or equal to about 1.5 wt % to less than or equal to about 8.5 wt %, from greater than or equal to about 2.0 wt % to less than or equal to about 8.0 wt %, from greater than or equal to about 2.5 wt % to less than or equal to about 7.5 wt %, from greater than or equal to about 3.0 wt % to less than or equal to about 7.0 wt %, from greater than or equal to about 3.5 wt % to less than or equal to about 6.5 wt %, from greater than or equal to about 4.0 wt % to less than or equal to about 6.0 wt %, from greater than or equal to about 4.5 wt % to less than or equal to about 5.5 wt %, or about 5.0 wt %, and all ranges and sub-ranges between the foregoing values. In embodiments, the glass ceramic may be substantially free or free of ZnO.

The glass ceramics of embodiments may further comprise MgO. The presence of MgO in the glass may increase the elastic modulus. The MgO also acts as a flux, lowering the cost of the production of the precursor glass. In the glass ceramic, the MgO may be present in β-spodumene crystals as a partial solid solution. In embodiments, the amount of MgO in the glass ceramic is greater than or equal to about 0.0 wt %, such as greater than or equal to about 0.5 wt %, greater than or equal to about 1.0 wt %, greater than or equal to about 1.5 wt %, greater than or equal to about 2.0 wt %, greater than or equal to about 2.5 wt %, greater than or equal to about 3.0 wt %, greater than or equal to about 3.5 wt %, greater than or equal to about 4.0 wt %, greater than or equal to about 4.5 wt %, greater than or equal to about 5.0 wt %, greater than or equal to about 5.5 wt %, greater than or equal to about 6.0 wt %, greater than or equal to about 6.5 wt %, greater than or equal to about 7.0 wt %, or greater than or equal to about 7.5 wt %. In embodiments, the amount of MgO in the glass ceramic is less than or equal to about 8.0 wt %, such as less than or equal to about 7.5 wt %, less than or equal to about 7.0 wt %, less than or equal to about 6.5 wt %, less than or equal to about 6.0 wt %, less than or equal to about 5.5 wt %, less than or equal to about 5.0 wt %, less than or equal than about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the amount of MgO in the glass ceramic is greater than or equal to about 0.0 wt % to less than or equal to about 8.0 wt %, such as from greater than or equal to about 0.5 wt % to less than or equal to about 7.5 wt %, from greater than or equal to about 1.0 wt % to less than or equal to about 7.0 wt %, from greater than or equal to about 1.5 wt % to less than or equal to about 6.5 wt %, from greater than or equal to about 2.0 wt % to less than or equal to about 6.0 wt %, from greater than or equal to about 2.5 wt % to less than or equal to about 5.5 wt %, from greater than or equal to about 3.0 wt % to less than or equal to about 5.0 wt %, from greater than or equal to about 3.5 wt % to less than or equal to about 4.5 wt %, or about 4.0 wt %, and all ranges and sub-ranges between the foregoing values.

The glass ceramics of embodiments may further include $TiO_2$. The $TiO_2$ may act as a nucleating agent and in some cases may act as a colorant. In embodiments, the glass may include $TiO_2$ in an amount greater than or equal to about 0.5 wt %, such as greater than or equal to about 1.0 wt %, greater than or equal to about 1.5 wt %, greater than or equal to about 2.0 wt %, greater than or equal to about 2.5 wt %, greater than or equal to about 3.0 wt %, greater than or equal to about 3.5 wt %, greater than or equal to about 4.0 wt %, or greater than or equal to about 4.5 wt %. In embodiments, the glass may include $TiO_2$ in an amount less than or equal to about 5.0 wt %, such as less than or equal to about 4.5 wt %, less than or equal to about 4.0 wt %, less than or equal to about 3.5 wt %, less than or equal to about 3.0 wt %, or less than or equal to about 2.5 wt %. It should be understood that, in embodiments, any of the above ranges may be combined with any other range. In other embodiments, the glass may include $TiO_2$ in an amount from greater than or equal to about 0.5 wt % to less than or equal to about 5.0 wt %, such as an amount from greater than or equal to about 1.0 wt % to less than or equal to about 4.5 wt %, from greater than or equal to about 1.5 wt % to less than or equal to about 4.0 wt %, from greater than or equal to about 2.0 wt % to less than or equal to about 3.5 wt %, or from greater than or equal to about 2.5 wt % to less than or equal to about 3.0 wt %, and all ranges and sub-ranges between the foregoing values.

In embodiments, the glass ceramic may optionally include one or more fining agents. In some embodiments, the fining agents may include, for example, $SnO+SnO_2$ and/or $As_2O_3$. In embodiments, $SnO+SnO_2$ may be present in the glass composition in an amount less than or equal to 0.5 wt %, such as from greater than or equal to 0.05 wt % to less than or equal to 0.5 wt %, greater than or equal to 0.1 wt % to less than or equal to 0.4 wt %, or greater than or equal to 0.2 wt % to less than or equal to 0.3 wt %, and all ranges and sub-ranges between the foregoing values. In embodiments, the glass ceramic may be free or substantially free of one or both of arsenic and antimony.

In embodiments, the glass ceramic may include $CeO_2$. The $CeO_2$ may be present in the glass ceramic in an amount from greater than or equal to 0 wt % to less than or equal to about 0.4 wt %, such as from greater than or equal to about 0.1 wt % to less than or equal to about 0.3 wt %, or about 0.2 wt %, and all ranges and sub-ranges between the foregoing values.

The glass ceramic includes colorants to produce the desired black color and opacity. The colorants may be selected from $FeO+Fe_2O_3$, NiO, $Co_3O_4$, $TiO_2$, $MnO+MnO_2+Mn_2O_3$, $Cr_2O_3$, CuO, and/or $V_2O_5$. In some embodiments, the glass ceramic includes a mixture of $FeO+Fe_2O_3$, NiO, and $Co_3O_4$, which allows the achievement of the desired color space. The colorants may partition into a magnetite phase in the glass ceramic.

In some embodiments, the glass includes FeO and/or $Fe_2O_3$ such that $FeO+Fe_2O_3$ is included in an amount greater than or equal to about 0.1 wt %, such as greater than or equal to about 0.5 wt %, greater than or equal to about 1.0 wt %, greater than or equal to about 1.5 wt %, greater than or equal to about 2.0 wt %, greater than or equal to about 3.5 wt %, greater than or equal to about 4.0 wt %, or greater than or equal to about 4.5 wt %. In some embodiments, the glass includes $FeO+Fe_2O_3$ in an amount of less than or equal to about 5.0 wt %, such as less than or equal to about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the glass may include $FeO+Fe_2O_3$ in an amount from greater than or equal to about 0.1 wt % to less than or equal to about 5.0 wt %, such as an amount from greater than or equal to about 0.5 wt % to less than or equal to about 4.5 wt %, from greater than or equal to about 1.0 wt % to less than or equal to about 4.0 wt %, from greater than or equal to about 1.5 wt % to less than or equal to about 3.5 wt %, from greater than or equal to about 2.0 wt % to less than or equal to about 3.0 wt %, or about 2.5 wt %, and all ranges and sub-ranges between the foregoing values. In embodiments, the glass may include $FeO+Fe_2O_3$ in an amount from greater than or equal to about 1.0 wt % to less than or equal to about 4.0 wt %.

In some embodiments, the glass includes NiO in an amount greater than or equal to about 0.1 wt %, such as greater than or equal to about 0.5 wt %, greater than or equal to about 1.0 wt %, greater than or equal to about 1.5 wt %, greater than or equal to about 2.0 wt %, greater than or equal to about 3.5 wt %, greater than or equal to about 4.0 wt %, or greater than or equal to about 4.5 wt %. In some embodiments, the glass includes NiO in an amount of less than or equal to about 5.0 wt %, such as less than or equal to about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the glass may include NiO in an amount from greater than or equal to about 0.1 wt % to less than or equal to about 5.0 wt %, such as an amount from greater than or equal to about 0.5 wt % to less than or equal to about 4.5 wt %, from greater than or equal to about 1.0 wt % to less than or equal to about 4.0 wt %, from greater than or equal to about 1.5 wt % to less than or equal to about 3.5 wt %, from greater than or equal to about 2.0 wt % to less than or equal to about 3.0 wt %, or about 2.5 wt %, and all ranges and sub-ranges between the foregoing values. In embodiments, the glass may include NiO in an amount from greater than or equal to about 0.5 wt % to less than or equal to about 1.5 wt %.

In some embodiments, the glass includes $Co_3O_4$ in an amount greater than or equal to about 0.1 wt %, such as greater than or equal to about 0.5 wt %, greater than or equal to about 1.0 wt %, greater than or equal to about 1.5 wt %, greater than or equal to about 2.0 wt %, greater than or equal to about 3.5 wt %, greater than or equal to about 4.0 wt %, or greater than or equal to about 4.5 wt %. In some embodiments, the glass includes $Co_3O_4$ in an amount of less than or equal to about 5.0 wt %, such as less than or equal to about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the glass may include $Co_3O_4$ in an amount from greater than or equal to about 0.1 wt % to less than or equal to about 5.0 wt %, such as an amount from greater than or equal to about 0.5 wt % to less than or equal to about 4.5 wt %, from greater than or equal to about 1.0 wt % to less than or equal to about 4.0 wt %, from greater than or equal to about 1.5 wt % to less than or equal to about 3.5 wt %, from greater than or equal to about 2.0 wt % to less than or equal to about 3.0 wt %, or about 2.5 wt %, and all ranges and sub-ranges between the foregoing values. In embodiments, the glass may include $Co_3O_4$ in an amount from greater than or equal to about 0.1 wt % to less than or equal to about 0.4 wt %.

In embodiments, the glass ceramic may include MnO, $MnO_2$, and/or $Mn_2O_3$ such that $MnO+MnO_2+Mn_2O_3$ may be included in the glass ceramic in an amount from greater than or equal to 0 wt % to less than or equal to about 4.0 wt %, such as greater than or equal to about 0.5 wt % to less than or equal to about 3.5 wt %, greater than or equal to about 1.0 wt % to less than or equal to about 3.0 wt %, greater than or equal to about 1.5 wt % to less than or equal to about 2.5 wt %, or about 2.0 wt %, and all ranges and sub-ranges between the foregoing values.

In embodiments, $Cr_2O_3$ may be included in the glass ceramic in an amount from greater than or equal to 0 wt % to less than or equal to about 2.0 wt %, such as greater than or equal to about 0.5 wt % to less than or equal to about 1.5 wt %, or about 1.0 wt %, and all ranges and sub-ranges between the foregoing values.

In embodiments, CuO may be included in the glass ceramic in an amount from greater than or equal to 0 wt % to less than or equal to about 2.0 wt %, such as greater than or equal to about 0.5 wt % to less than or equal to about 1.5 wt %, or about 1.0 wt %, and all ranges and sub-ranges between the foregoing values.

In embodiments, $V_2O_5$ may be included in the glass ceramic in an amount from greater than or equal to 0 wt % to less than or equal to about 2.0 wt %, such as greater than or equal to about 0.5 wt % to less than or equal to about 1.5 wt %, or about 1.0 wt %, and all ranges and sub-ranges between the foregoing values.

From the above, glass ceramics according to embodiments may be formed from precursor glass articles formed by any suitable method, such as slot forming, float forming, rolling processes, fusion forming processes, molding processes, etc. A precursor glass article may be characterized by the manner in which it is formed. For instance, where the precursor glass article may be characterized as float-formable (i.e., formed by a float process), down-drawable and, in particular, fusion-formable or slot-drawable (i.e., formed by a down draw process such as a fusion draw process or a slot draw process).

Some embodiments of the precursor glass articles described herein may be formed by a down-draw process. Down-draw processes produce glass articles having a uniform thickness that possess relatively pristine surfaces. Because the average flexural strength of the glass article is controlled by the amount and size of surface flaws, a pristine surface that has had minimal contact has a higher initial strength. In addition, down drawn glass articles have a very flat, smooth surface that can be used in its final application without costly grinding and polishing.

Some embodiments of the precursor glass articles described herein may be formed by a slot draw process. The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass article and into an annealing region.

The glass ceramics may be formed by ceramming a precursor glass under any suitable conditions. The ceramming cycle includes a nucleation step and a growth step. In some embodiments, the ceramming cycle may include three separate heat treatment steps at three separate temperatures.

In embodiments, the nucleation step and the growth step (or ceramming step) occur at temperatures of greater than or equal to about 500° C., such as greater than or equal to about 525° C., greater than or equal to about 550° C., greater than or equal to about 575° C., greater than or equal to about 600° C., greater than or equal to about 625° C., greater than or equal to about 650° C., greater than or equal to about 675° C., greater than or equal to about 700° C., greater than or equal to about 725° C., greater than or equal to about 750° C., greater than or equal to about 775° C., greater than or equal to about 800° C., greater than or equal to about 825° C., greater than or equal to about 850° C., or greater than or equal to about 875° C. In embodiments, the nucleation step and the growth step occurs at temperatures of from greater than or equal to about 500° C. to less than or equal to about 900° C., such as greater than or equal to about 525° C. to less than or equal to about 875° C., greater than or equal to about 550° C. to less than or equal to about 850° C., greater than or equal to about 575° C. to less than or equal to about 825° C., greater than or equal to about 600° C. to less than or equal to about 800° C., greater than or equal to about 625° C. to less than or equal to about 775° C., greater than or equal to about 650° C. to less than or equal to about 750° C., greater than or equal to about 675° C. to less than or equal to about 725° C., or about 700° C., and all ranges and sub-ranges between the foregoing values.

In embodiments, the individual steps of the ceramming cycle extend for a time period greater than or equal to about 1.0 hour, such as greater than or equal to about 1.5 hours, greater than or equal to about 2.0 hours, greater than or equal to about 2.5 hours, greater than or equal to about 3.0 hours, greater than or equal to about 3.5 hours, greater than or equal to about 4.0 hours, greater than or equal to about 4.5 hours, greater than or equal to about 5.0 hours, greater than or equal to about 5.5 hours, or greater than or equal to about 6.0 hours, greater than or equal to about 6.5 hours, greater than or equal to about 7.0 hours, greater than or equal to about 7.5 hours, or greater than or equal to about 8.0 hours. In embodiments, the individual steps of the ceramming cycle extend for a time period from greater than or equal to about 1.0 hour to less than or equal to about 8.0 hours, such as greater than or equal to about 1.5 hours to less than or equal to about 7.5 hours, greater than or equal to about 2.0 hours to less than or equal to about 7.0 hours, greater than or equal to about 1.5 hours to less than or equal to about 6.5 hours, greater than or equal to about 2.0 hours to less than or equal to about 6.0 hours, greater than or equal to about 2.5 hours to less than or equal to about 5.5 hours, greater than or equal to about 3.0 hours to less than or equal to about 5.0 hours, greater than or equal to about 3.5 hours to less than or equal to about 4.5 hours, or about 4.0 hours, and all ranges and sub-ranges between the foregoing values.

In embodiments, the ceramming cycle extends for a total time period greater than or equal to about 1.0 hour, such as greater than or equal to about 1.5 hours, greater than or equal to about 2.0 hours, greater than or equal to about 2.5 hours, greater than or equal to about 3.0 hours, greater than or equal to about 3.5 hours, greater than or equal to about 4.0 hours, greater than or equal to about 4.5 hours, greater than or equal to about 5.0 hours, greater than or equal to about 5.5 hours, or greater than or equal to about 6.0 hours, greater than or equal to about 6.5 hours, greater than or equal to about 7.0 hours, greater than or equal to about 7.5 hours, greater than or equal to about 8.0 hours, greater than or equal to about 8.5 hours, greater than or equal to about 9.0 hours, greater than or equal to about 9.5 hours, greater than or equal to about 10.0 hours, greater than or equal to about 10.5 hours, greater than or equal to about 11.0 hours greater than or equal to about 11.5 hours, greater than or equal to about 12.0 hours, greater than or equal to about 12.5 hours, greater than or equal to about 13.0 hours, greater than or equal to about 13.5 hours, greater than or equal to about 14.0 hours, greater than or equal to about 14.5 hours, greater than or equal to about 15.0 hours, or greater than or equal to about 15.5 hours. In embodiments, the ceramming cycle extends for a total time period from greater than or equal to about 4 hours to less than or equal to about 16.0 hours, such as greater than or equal to about 4.5 hours to less than or equal to about 15.5 hours, greater than or equal to about 5.0 hours to less than or equal to about 15.0 hours, greater than or equal to about 5.5 hours to less than or equal to about 14.5 hours, greater than or equal to about 6.0 hours to less than or equal to about 14.0 hours, greater than or equal to about 6.5 hours to less than or equal to about 13.5 hours, greater than or equal to about 7.0 hours to less than or equal to about 13.0 hours, greater than or equal to about 7.5 hours to less than or equal to about 12.5 hours, greater than or equal to about 8.0 hours to less than or equal to about 12.0 hours, greater than or equal to about 8.5 hours to less than or equal to about 11.5 hours, greater than or equal to about 9.0 hours to less than or equal to about 11.0 hours, greater than or equal to about 9.5 hours to less than or equal to about 10.5 hours, or about 10.0 hours, and all ranges and sub-ranges between the foregoing values.

In embodiments, the precursor glass articles and/or nucleated articles may be machined to form a substantially final geometry part prior to being cerammed. The machining may include the formation of slots, holes, and regions with varying thickness. In embodiments, the glass may have an engineered edge profile and/or a three-dimensional shape.

In embodiments, the glass ceramics are also chemically strengthened, such as by ion exchange, producing a glass ceramic that is damage resistant for applications such as, but not limited to electronic device housings. The chemical strengthening process may increase strength, such as the ring-on-ring strength, of the glass ceramic article. With reference to FIG. 1, the glass ceramic has a first region under compressive stress (e.g., first and second compressive layers 120, 122 in FIG. 1) extending from the surface to a depth of compression (DOC) of the glass ceramic and a second region (e.g., central region 130 in FIG. 1) under a tensile stress or central tension (CT) extending from the DOC into the central or interior region of the glass ceramic. As used herein, DOC refers to the depth at which the stress within the glass ceramic changes from compressive to tensile. At the DOC, the stress crosses from a positive (compressive) stress to a negative (tensile) stress and thus exhibits a stress value of zero.

According to the convention normally used in the art, compression or compressive stress is expressed as a negative (<0) stress and tension or tensile stress is expressed as a positive (>0) stress. Throughout this description, however, CS is expressed as a positive or absolute value—i.e., as recited herein, CS=|CS|. The compressive stress (CS) may have a maximum at the surface of the glass, and the CS may vary with distance d from the surface according to a function. Referring again to FIG. 1, a first compressive layer 120 extends from first surface 110 to a depth d1 and a second compressive layer 122 extends from second surface 112 to a depth dz. Together, these segments define a compression or CS of glass ceramic 100.

The compressive stress of both compressive stress regions (120, 122 in FIG. 1) is balanced by stored tension in the central region (130) of the glass ceramic. The DOC values may be approximated based on the concentration profile of the ions exchanged into the glass ceramic articles during the ion exchange treatment, such as the depth below the surface of the glass ceramic article where the measured concentration becomes substantially equal to the concentration in the glass ceramic article prior to the ion exchange treatment.

Without wishing to be bound by any particular theory, the lithium ions contained in the residual glass phase and the β-spodumene crystal phase may be exchanged with (replaced by) sodium and/or potassium ions from the ion exchange solution during an ion exchange process. The ion exchangeability of the β-spodumene crystal phase enhances the effectiveness of ion exchanging the glass ceramic to produce a compressive stress layer. Similarly, sodium ions in the residual glass phase may be exchanged with (replaced by) potassium ions from the ion exchange solution during an ion exchange process. Lithium ions in the lithium disilicate crystal phase may be ion exchanged through a surface amorphization mechanism.

Compressive stress layers may be formed in the glass ceramic by exposing the glass to an ion exchange solution. In embodiments, the ion exchange solution may contain molten nitrate salt. In some embodiments, the ion exchange solution may be molten $KNO_3$, molten $NaNO_3$, molten $LiNO_3$, or combinations thereof. In embodiments, the ion exchange solution may comprise less than or equal to about 100% molten $KNO_3$, such as less than or equal to about 95% molten $KNO_3$, less than or equal to about 90% molten $KNO_3$, less than or equal to about 85% molten $KNO_3$, less than or equal to about 80% molten $KNO_3$, less than or equal to about 75% molten $KNO_3$, less than or equal to about 70% molten $KNO_3$, less than or equal to about 65% molten $KNO_3$, less than or equal to about 60% molten $KNO_3$, or less. In certain embodiments, the ion exchange solution may comprise greater than or equal to about 20% molten $NaNO_3$, such as greater than or equal to about 25% molten $NaNO_3$, greater than or equal to about 30% molten $NaNO_3$, greater than or equal to about 35% molten $NaNO_3$, greater than or equal to about 40% molten $NaNO_3$, or more. In embodiments, the ion exchange solution may comprise about 80% molten $KNO_3$ and about 20% molten $NaNO_3$, about 75% molten $KNO_3$ and about 25% molten $NaNO_3$, about 70% molten $KNO_3$ and about 30% molten $NaNO_3$, about 65% molten $KNO_3$ and about 35% molten $NaNO_3$, or about 60% molten $KNO_3$ and about 40% molten $NaNO_3$, and all ranges and sub-ranges between the foregoing values. In embodiments, the ion exchange solution may a molten salt bath including a mixture of $KNO_3$, $NaNO_3$, and $LiNO_3$. In embodiments, other sodium and potassium salts may be used in the ion exchange solution, such as, for example sodium or potassium nitrites, phosphates, or sulfates. In embodiments, the ion exchange solution may include a silver salt, such as silver nitrate, for the exchange of silver ions into the glass ceramic. The exchange of silver ions into the glass ceramic may produce a glass ceramic article with antimicrobial and/or antibacterial properties. In embodiments, the ion exchange solution may contain silicic acid, such as less than or equal to about 1 wt % silicic acid.

The glass ceramic may be exposed to the ion exchange solution by dipping the glass ceramic into a bath of the ion exchange solution, spraying the ion exchange solution onto the glass ceramic, or otherwise physically applying the ion exchange solution to the glass ceramic. Upon exposure to the glass ceramic, the ion exchange solution may, according to embodiments, be at a temperature from greater than or equal to 400° C. to less than or equal to 500° C., such as from greater than or equal to 410° C. to less than or equal to 490° C., from greater than or equal to 420° C. to less than or equal to 480° C., from greater than or equal to 430° C. to less than or equal to 470° C., or from greater than or equal to 440° C. to less than or equal to 460° C., and all ranges and sub-ranges between the foregoing values. In embodiments, the glass ceramic may be exposed to the ion exchange solution for a duration from greater than or equal to 4 hours to less than or equal to 48 hours, such as from greater than or equal to 8 hours to less than or equal to 44 hours, from greater than or equal to 12 hours to less than or equal to 40 hours, from greater than or equal to 16 hours to less than or equal to 36 hours, from greater than or equal to 20 hours to less than or equal to 32 hours, or from greater than or equal to 24 hours to less than or equal to 28 hours, and all ranges and sub-ranges between the foregoing values.

The ion exchange process may be performed in an ion exchange solution under processing conditions that provide an improved compressive stress profile as disclosed, for example, in U.S. Patent Application Publication No. 2016/0102011, which is incorporated herein by reference in its entirety.

After an ion exchange process is performed, it should be understood that a composition at the surface of the glass ceramic may be different than the composition of the as-formed glass ceramic (i.e., the glass ceramic before it undergoes an ion exchange process). This results from one type of alkali metal ion in the glass phase of the as-formed glass ceramic, such as, for example $Li^+$ or $Na^+$, being replaced with larger alkali metal ions, such as, for example $Na^+$ or $K^+$, respectively. However, the composition of the glass ceramic at or near the center of the depth of the glass article will, in embodiments, be the least influenced by the ion exchange treatment and may have a composition substantially the same as or the same as the as-formed glass ceramic.

In embodiments, the ion exchanged glass ceramic articles may have a surface compressive stress of greater than or equal to about 250 MPa, such as greater than or equal to about 260 MPa, greater than or equal to about 270 MPa, greater than or equal to about 280 MPa, greater than or equal to about 290 MPa, greater than or equal to about 300 MPa, greater than or equal to about 310 MPa, greater than or equal to about 320 MPa, greater than or equal to about 330 MPa, greater than or equal to about 340 MPa, greater than or equal to about 350 MPa, greater than or equal to about 360 MPa, greater than or equal to about 370 MPa, greater than or equal to about 380 MPa, greater than or equal to about 390 MPa, greater than or equal to about 400 MPa, greater than or equal to about 410 MPa, greater than or equal to about 420 MPa, greater than or equal to about 430 MPa, greater than or equal to about 440 MPa, greater than or equal to about 450 MPa, greater than or equal to about 460 MPa, greater than or equal to about 470 MPa, greater than or equal to about 480 MPa, greater than or equal to about 490 MPa, greater than or equal to about 500 MPa, greater than or equal to about 510 MPa, greater than or equal to about 520 MPa, greater than or equal to about 530 MPa, greater than or equal to about 540 MPa, greater than or equal to about 550 MPa, greater than or equal to about 560 MPa, greater than or equal to about 570 MPa, greater than or equal to about 580 MPa, greater than or equal to about 590 MPa, greater than or equal to about 600 MPa, greater than or equal to about 610 MPa, greater than or equal to about 620 MPa, greater than or equal to about 630 MPa, or greater than or equal to about 640 MPa. In embodiments, the ion exchanged glass ceramic articles may have a surface compressive stress from greater than or equal to about 250 MPa to less than or equal to about 650 MPa, such as greater than or equal to about 260 MPa to less than or equal to about 640 MPa, greater than or equal to about 270 MPa to less than or equal to about 630 MPa, greater than or equal to about 280 MPa to less than or equal to about 620 MPa, greater than or equal to about 290 MPa to less than or equal to about 610 MPa, greater than or equal to about 300 MPa to less than or equal to about 600 MPa, greater than or equal to about 310 MPa to less than or equal to about 590 MPa, greater than or equal to about 320 MPa to less than or equal to about 580 MPa, greater than or equal to about 330 MPa to less than or equal to about 570 MPa, greater than or equal to about 340 MPa to less than or equal to about 560 MPa, greater than or equal to about 350 MPa to less than or equal to about 550 MPa, greater than or equal to about 360 MPa to less than or equal to about 540 MPa, greater than or equal to about 370 MPa to less than or equal to about 530 MPa, greater than or equal to about 380 MPa to less than or equal to about 520 MPa, greater than or equal to about 390 MPa to less than or equal to about 510 MPa, greater than or equal to about 400 MPa to less than or equal to about 500 MPa, greater than or equal to about 410 MPa to less than or equal to about 490 MPa, greater than or equal to about 420 MPa to less than or equal to about 480 MPa, greater than or equal to about 430 MPa to less than or equal to about 470 MPa, greater than or equal to about 440 MPa to less than or equal to about 460 MPa, or about 450 MPa, and all ranges and sub-ranges between the foregoing values.

In embodiments, the ion exchanged glass ceramic articles may have a depth of the compressive stress layer (depth of compression) of greater than or equal to about 400 μm, such as greater than or equal to about 410 μm, greater than or equal to about 420 μm, greater than or equal to about 430 μm, greater than or equal to about 440 μm, greater than or equal to about 450 μm, greater than or equal to about 460 μm, greater than or equal to about 470 μm, greater than or equal to about 480 μm, greater than or equal to about 490 μm, greater than or equal to about 500 μm, or more. In embodiments, the ion exchanged glass ceramic articles may have a depth of compression of greater than or equal to about 40 μm, such as greater than or equal to about 50 μm, greater than or equal to about 60 μm, greater than or equal to about 70 μm, greater than or equal to about 80 μm, greater than or equal to about 90 μm, greater than or equal to about 100 μm, or more. In embodiments, the depth of compression may be from greater than or equal to about 40 μm to less than or equal to 500 μm, such as from greater than or equal to about 50 μm to less than or equal to about 480 μm, from greater than or equal to about 60 μm to less than or equal to about 460 μm, from greater than or equal to about 70 μm to less than or equal to about 440 μm, from greater than or equal to about 80 μm to less than or equal to about 420 μm, from greater than or equal to about 90 μm to less than or equal to about 400 μm, from greater than or equal to about 100 μm to less than or equal to about 380 μm, from greater than or equal to about 120 μm to less than or equal to about 360 μm, from greater than or equal to about 140 μm to less than or equal to about 340 μm, from greater than or equal to about 160 μm to less than or equal to about 320 μm, from greater than or equal to about 180 μm to less than or equal to about 300 μm, from greater than or equal to about 200 μm to less than or equal to about 280 μm, from greater than or equal to about 220 μm to less than or equal to about 260 μm, about 240 μm, and any and all sub-ranges formed from these endpoints.

In embodiments, the ion exchanged glass ceramic articles may have a depth of the compressive stress layer (depth of compression) of greater than or equal to about 0.05t where t is the thickness of the glass ceramic article, such as greater than or equal to about 0.1t, greater than or equal to about 0.15t, greater than or equal to about 0.2t, or more. In embodiments, the glass ceramic articles may have a depth of compression from greater than or equal to about 0.05t to less than or equal to 0.25t where t is the thickness of the glass ceramic article, such as from greater than or equal to about 0.1t to less than or equal to 0.2t, or about 0.05t, and any and all sub-ranges formed from these endpoints.

In embodiments, the ion exchanged glass ceramic may have a high strength. In some embodiments, the ion exchanged glass ceramic has a load to failure in a ring-on-ring test of greater than or equal to about 100 kgf, such as greater than or equal to about 105 kgf, greater than or equal to about 110 kgf, greater than or equal to about 115 kgf, or more. The ring-on-ring test is described below.

The glass ceramic articles may have a high body strength and a high abrasion resistance. The high abrasion resistance and high strength may be characterized by a retained strength measurement, taken after abrasion of the glass ceramic articles. The retained strength may be measured according to an abraded ring-on-ring test procedure as described below. In some embodiments, the glass ceramic articles may have a thickness of 0.8 thickness and a retained strength as measured by load to failure in an abraded ring-on-ring test after a 45 psi abrasion of greater than or equal to 60 kgf.

The glass ceramic articles may have any appropriate geometry. In embodiments, the glass ceramic articles may have a thickness of greater than or equal to about 0.4 mm, such as greater than or equal to about 0.5 mm, greater than or equal to about 0.6 mm, greater than or equal to about 0.7 mm, greater than or equal to about 0.8 mm, greater than or equal to about 0.9 mm, greater than or equal to about 1.0 mm, greater than or equal to about 1.5 mm, greater than or equal to about 2.0 mm, or more. In embodiments, the glass ceramic articles may have a thickness from greater than or equal to about 0.4 mm to less than or equal to about 2.0 mm, such as from greater than or equal to about 0.5 mm to less than or equal to about 1.5 mm, from greater than or equal to about 0.6 mm to less than or equal to about 1.0 mm, from greater than or equal to about 0.7 mm to less than or equal to about 0.9 mm, about 0.8 mm, and any and all sub-ranges formed from these endpoints. In embodiments, the glass ceramic articles have a thickness in the range from greater than or equal to about 0.8 mm to less than or equal to about 1.0 mm.

Figure 2A:
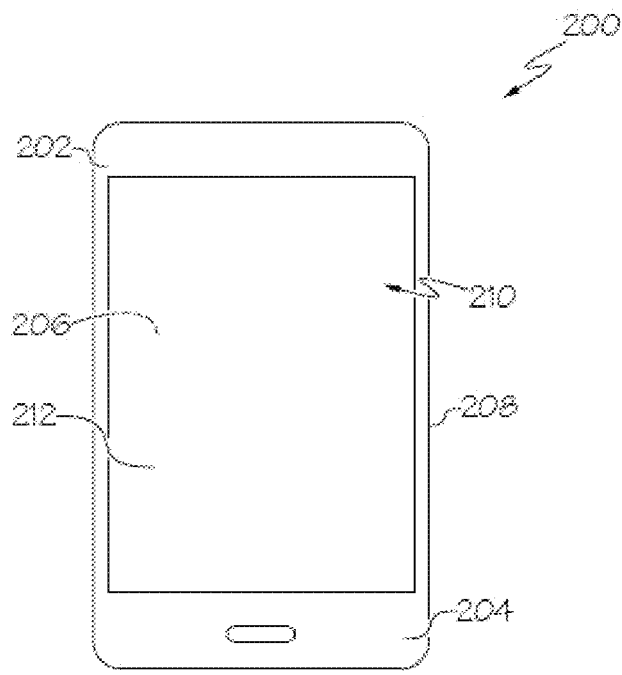
FIG. 2A is a plan view of an exemplary electronic device incorporating any of the glass ceramics disclosed herein.
Figure 2B:
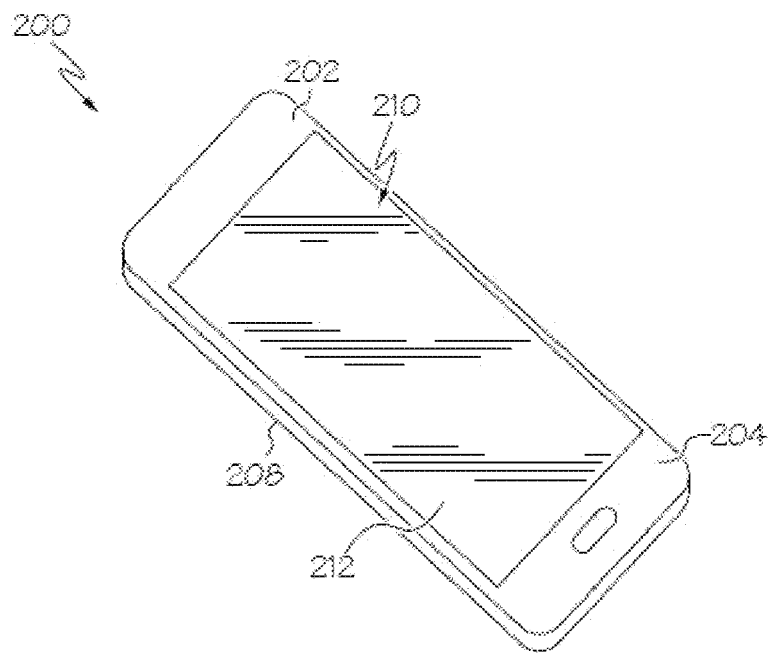
FIG. 2B is a perspective view of the exemplary electronic device of FIG. 2A.

The glass ceramic articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some scratch-resistance, abrasion resistance or a combination thereof. An exemplary article incorporating any of the glass ceramic articles disclosed herein is shown in FIGS. 2A and 2B. Specifically, FIGS. 2A and 2B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. In some embodiments, at least a portion of the housing 202 may include any of the glass ceramic articles disclosed herein.

EXAMPLES

Embodiments will be further clarified by the following examples. It should be understood that these examples are not limiting to the embodiments described above.

Glass ceramics having components, in wt %, listed in Table 1 below were prepared and cerammed. The samples had a thickness of 0.8 mm. The ceramming cycle included a ramp rate of 5° C./minute from room temperature to the nucleation temperature of 625° C., a hold at 625° C. for 4 hours, a ramp to 740° C. at a ramp rate of 5° C./minute, and a hold at 740° C. for 1 hour. The resulting samples in Table 1 exhibited a phase assemblage including β-spodumene, lithium disilicate, β-quartz, and magnetite, and had a black appearance.

After ceramming, the glass ceramic samples reported in Table 1 were ion exchanged for 4 hours in a molten salt bath including 60 wt % $KNO_3$ and 40 wt % $NaNO_3$ at a temperature of 470° C.

TABLE 1

| Oxides (wt %) | 1 | 2 | 3 | 4 | 5 | 6 | 7 |
|---|---|---|---|---|---|---|---|
| $SiO_2$ | 68.8 | 68.4 | 68.5 | 68.6 | 69.1 | 69.8 | 71.8 |
| $Al_2O_3$ | 8.1 | 8.1 | 8.1 | 8.1 | 8.2 | 8.2 | 8.5 |
| $Li_2O$ | 9.1 | 9.3 | 9.4 | 9.4 | 9.4 | 9.5 | 9.7 |
| $Na_2O$ | 1.9 | 1.9 | 1.9 | 1.9 | 1.9 | 1.9 | 2.0 |
| $ZrO_2$ | 3.4 | 3.5 | 3.5 | 3.5 | 3.5 | 3.5 | 3.6 |
| $P_2O_5$ | 2.3 | 2.3 | 2.3 | 2.3 | 2.3 | 2.3 | 2.4 |
| $TiO_2$ | 2.6 | 2.6 | 2.6 | 2.6 | 2.6 | 2.2 | 0.5 |
| $Fe_2O_3$ | 2.5 | 2.6 | 2.6 | 2.6 | 2.6 | 2.2 | 0.5 |
| NiO | 0.8 | 0.9 | 0.9 | 0.7 | 0 | 0.7 | 0.7 |
| $Co_3O_4$ | 0.2 | 0.13 | 0.0 | 0 | 0 | 0 | 0 |
| SnO2 | 0.2 | 0.14 | 0.15 | 0.18 | 0.18 | 0.18 | 0.18 |
| Color coordinates | L*: 27.6 a*: −0.1 b*: −0.7 | | | | | | |
| $K_{ic}$ (MPa · m^0.5) | 1.1 | | | | | | |
| Liquidus temperature (° C.) | 1055 | | | | | 1035 | 1050 |
| Liquidus phase | β-spodumene | | | | | β-spodumene | Lithiophosphate/ β-spodumene |

The phase assemblage of the glass ceramics was determined using X-ray diffraction (XRD) analysis of the cerammed samples. The appearance of the glass ceramics is an impression based on observation of the samples. The reflected color coordinates were measured using an X-rite Ci7 F02 illuminant under SCI UVC conditions. The liquidus temperature was measured in accordance with ASTM C829-81 (2015), titled "Standard Practice for Measurement of Liquidus Temperature of Glass by the Gradient Furnace Method" for the precursor glass. The viscosity of the glass at the liquidus temperature is measured in accordance with ASTM C965-96(2012), titled "Standard Practice for Measuring Viscosity of Glass Above the Softening Point" to determine the liquidus viscosity. The fracture toughness value ($K_{1C}$) was measured by the chevron notched short bar (CNSB) method disclosed in Reddy, K. P. R. et al, "Fracture Toughness Measurement of Glass and Ceramic Materials Using Chevron-Notched Specimens," J. Am. Ceram. Soc., 71 [6], C-310-C-313 (1988) except that $Y^*_m$ is calculated using equation 5 of Bubsey, R. T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (October 1992).

Figure 3:
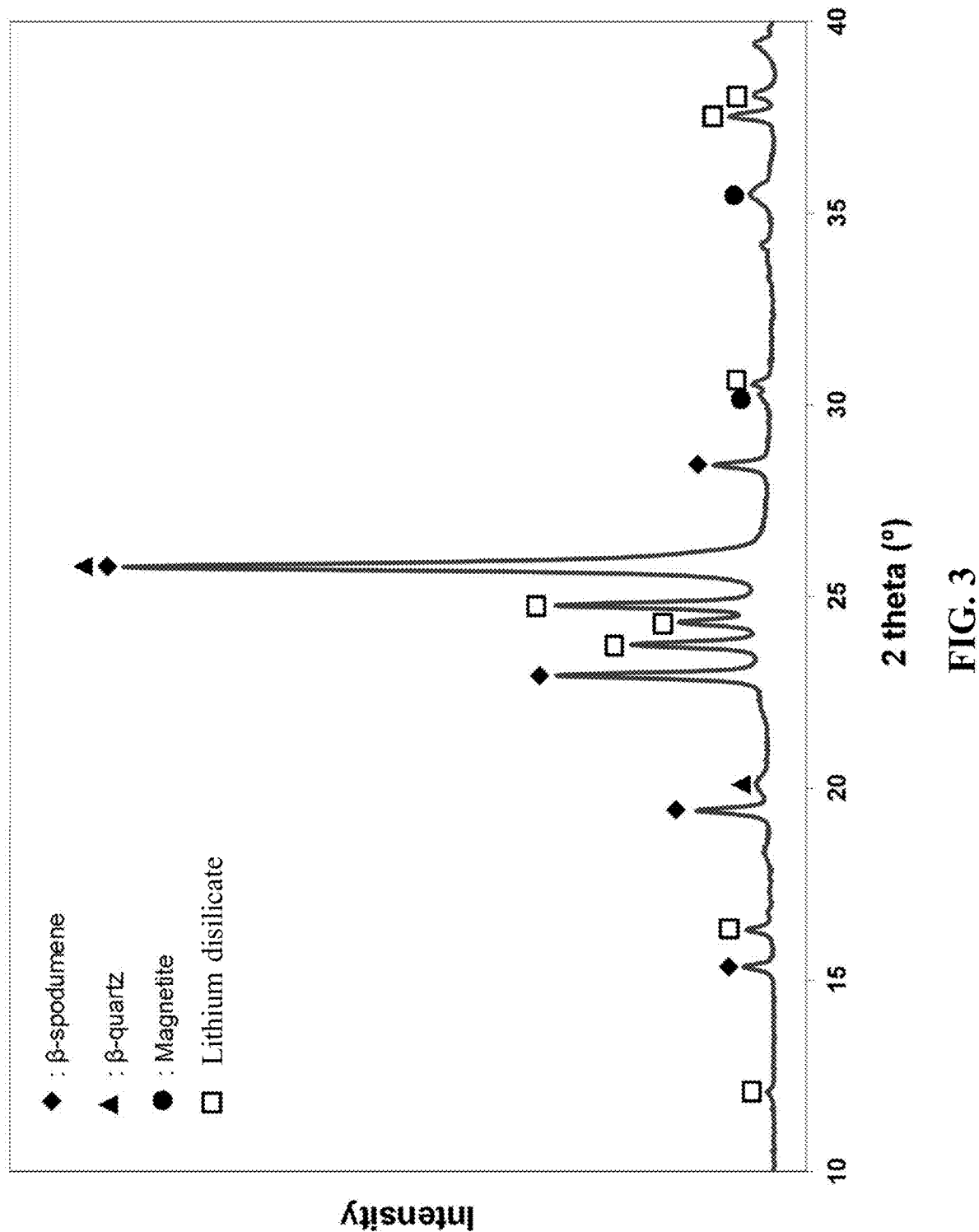
FIG. 3 is an X-ray diffraction analysis of a glass ceramic according to an embodiment.

The X-ray diffraction analysis of Sample 1 in Table 1 is shown in FIG. 3. As shown in FIG. 3, the black glass ceramic of Sample 1 is characterized by a phase assemblage including β-spodumene, lithium disilicate, β-quartz, and magnetite.

Figure 4:
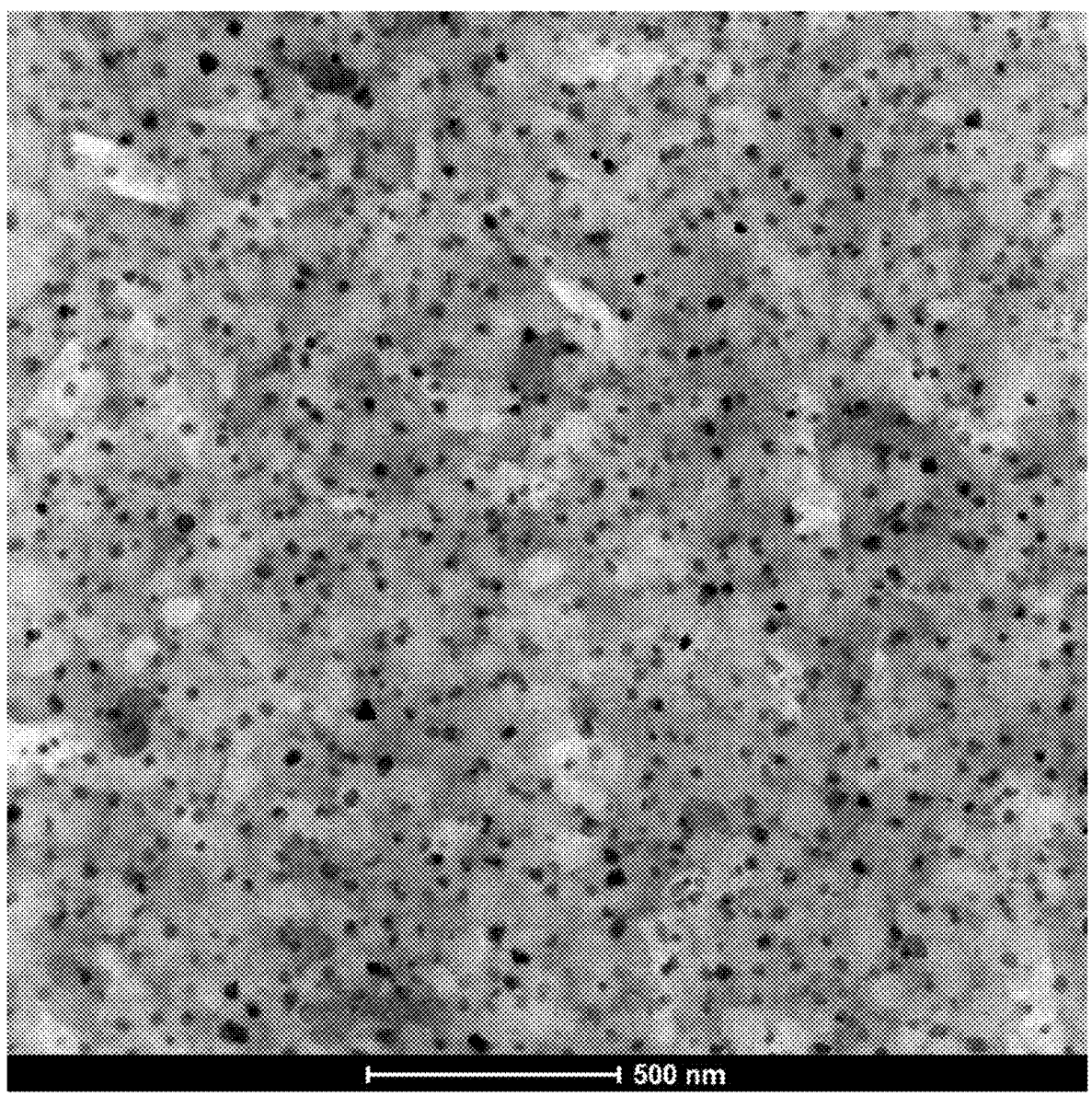
FIG. 4 is a tunneling electron microscope image of a glass ceramic according to an embodiment.
Figure 5:
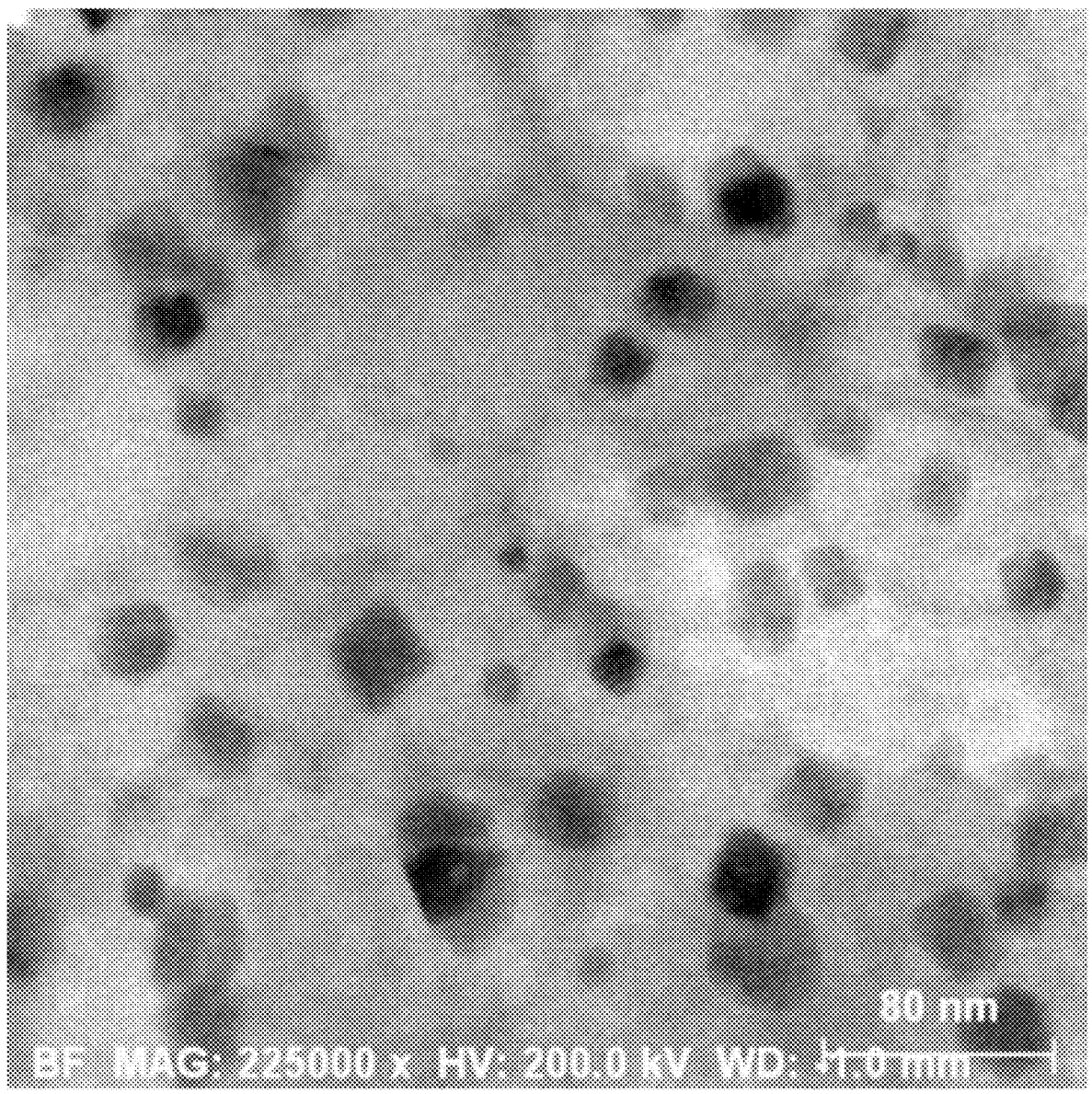
FIG. 5 is a tunneling electron microscope image of the glass ceramic of FIG. 4 at a higher magnification.
Figure 6:
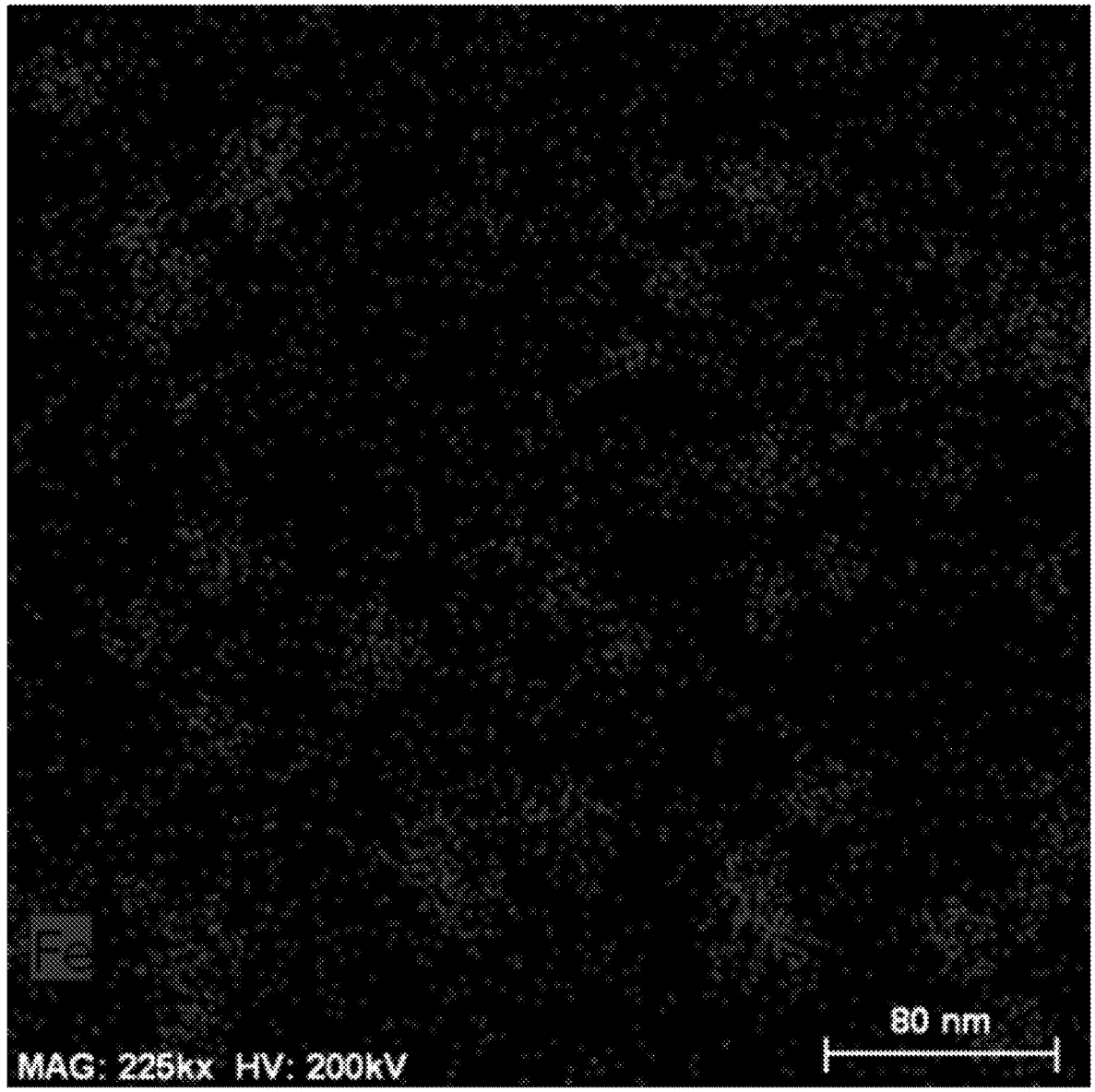
FIG. 6 is the tunneling electron microscope image of FIG. 5 with elemental mapping highlighting iron.
Figure 7:
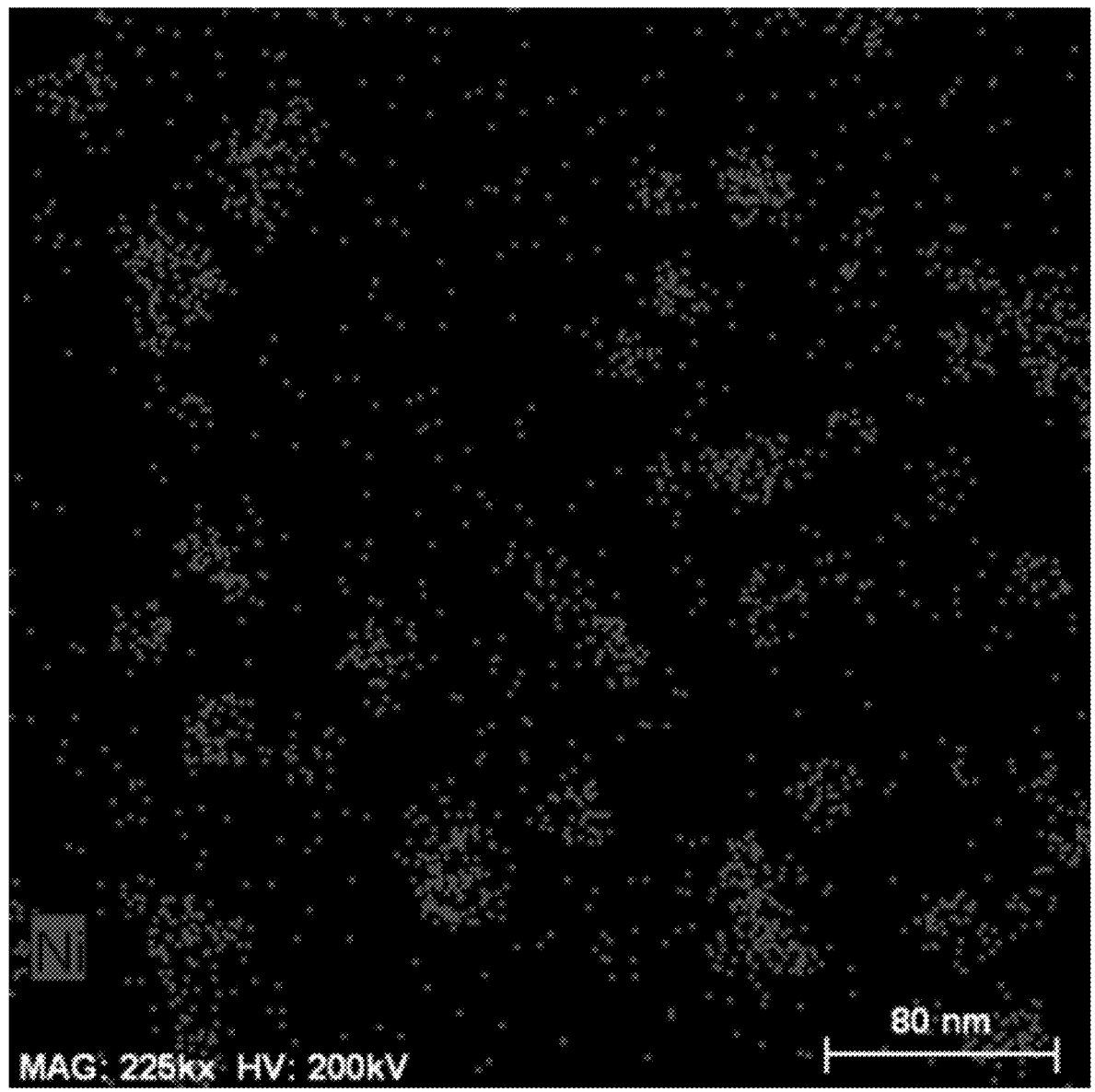
FIG. 7 is the tunneling electron microscope image of FIG. 5 with elemental mapping highlighting nickel.
Figure 8:
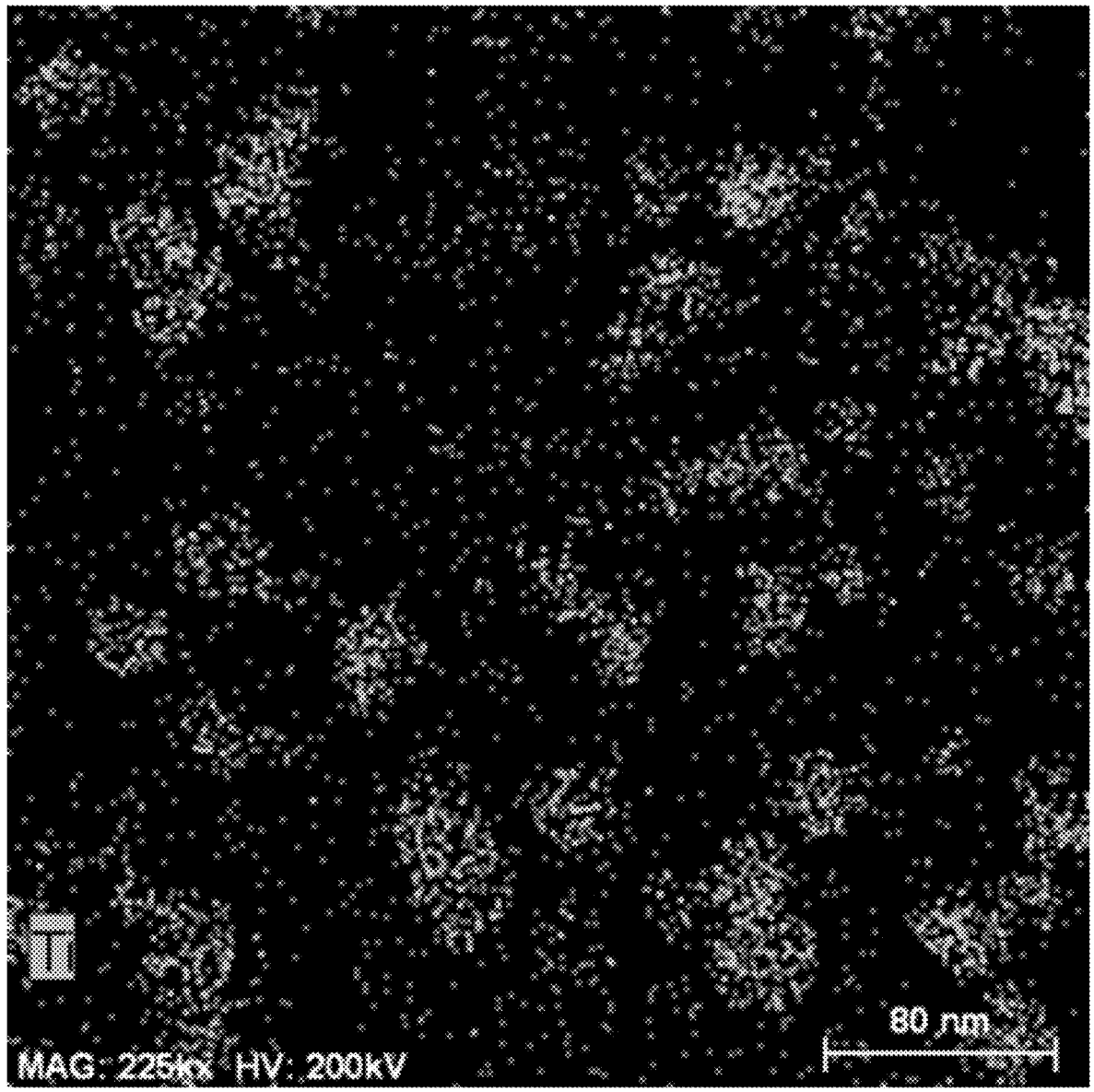
FIG. 8 is the tunneling electron microscope image of FIG. 5 with elemental mapping highlighting titanium.
Figure 9:
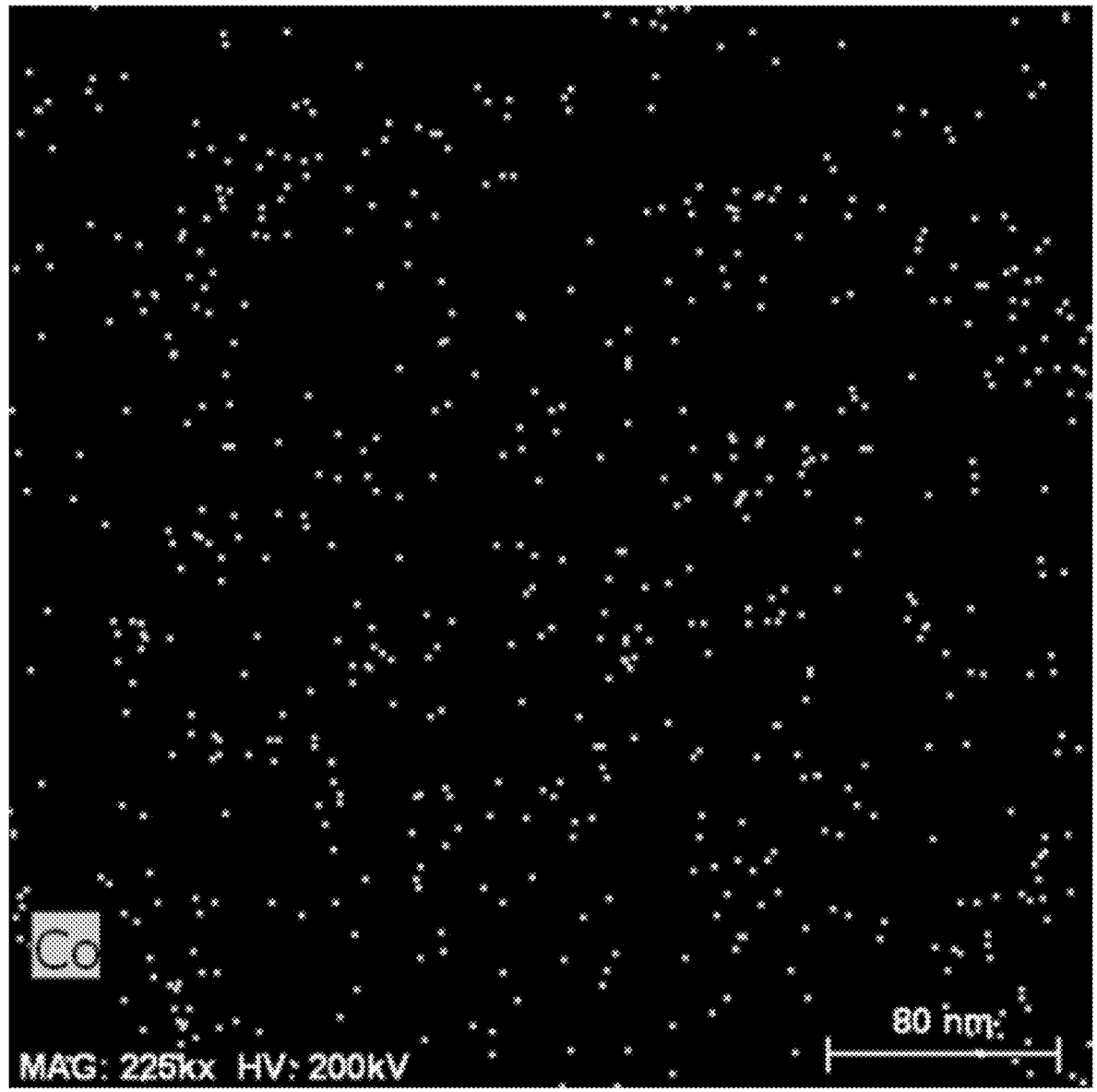
FIG. 9 is the tunneling electron microscope image of FIG. 5 with elemental mapping highlighting cobalt.
Figure 10:
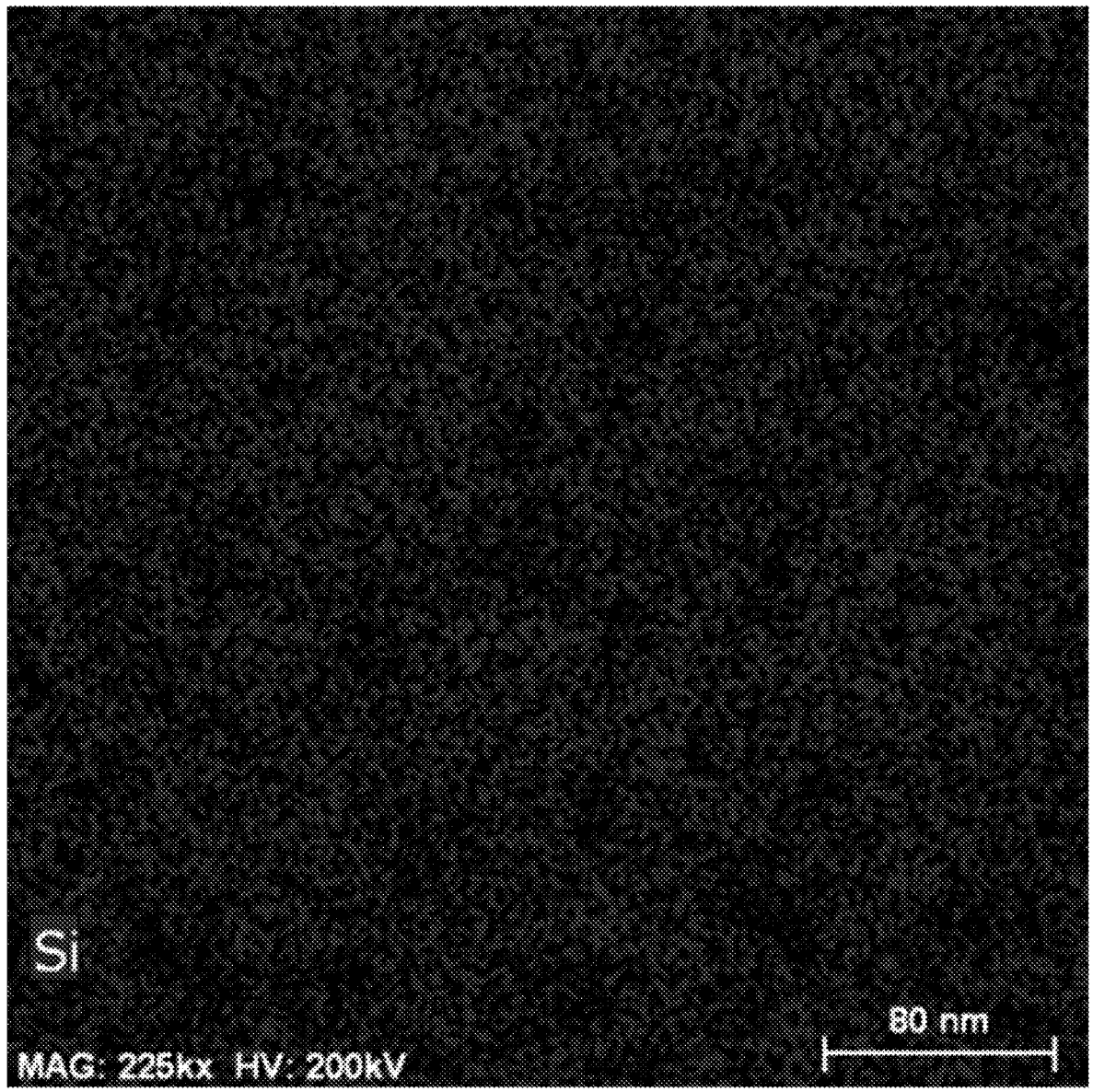
FIG. 10 is the tunneling electron microscope image of FIG. 5 with elemental mapping highlighting silicon.
Figure 11:
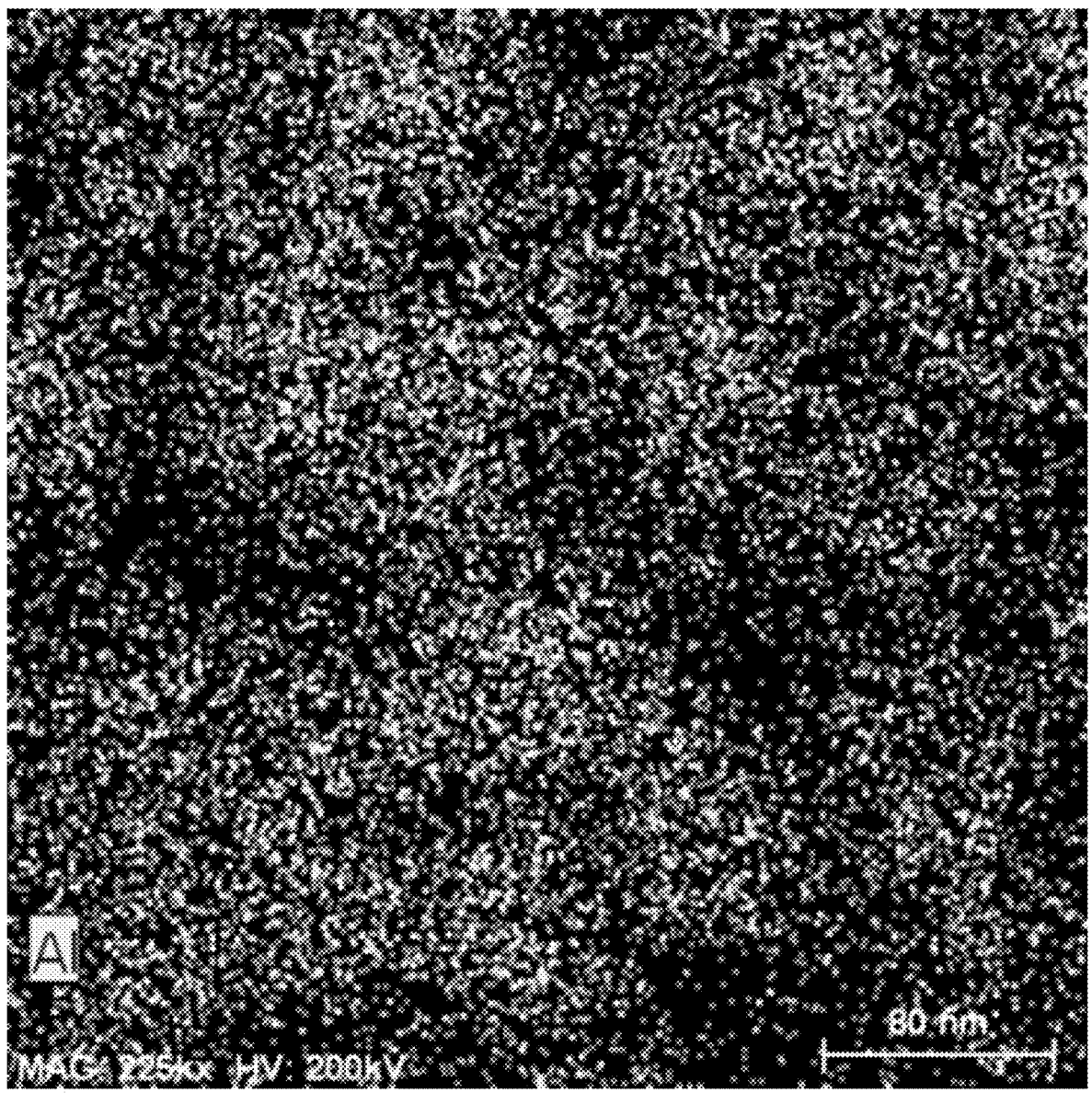
FIG. 11 is the tunneling electron microscope image of FIG. 5 with elemental mapping highlighting aluminum.
Figure 12:
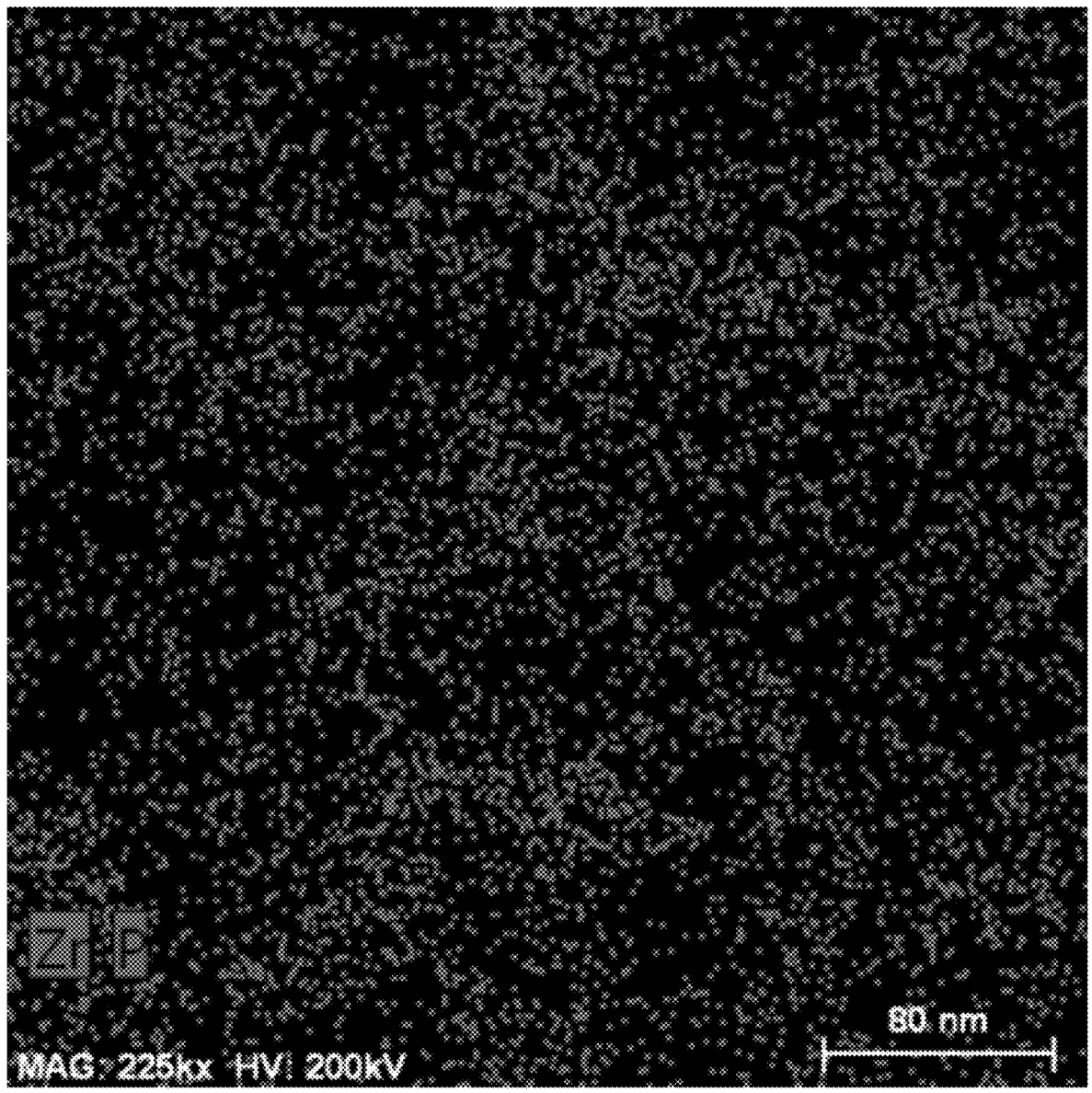
FIG. 12 is the tunneling electron microscope image of FIG. 5 with elemental mapping highlighting zirconium and phosphorous.

A tunneling electron microscope (TEM) was utilized to analyze Sample 1 of Table 1, as shown at different magnifications in FIGS. 4 and 5. The TEM image of FIG. 5 was analyzed using elemental mapping. The elementally mapped images are as follows: FIG. 6 maps iron, FIG. 7 maps nickel, FIG. 8 maps titanium, FIG. 9 maps cobalt, FIG. 10 maps silicon, FIG. 11 maps aluminum, and FIG. 12 maps zirconium and phosphorous.

Figure 13:
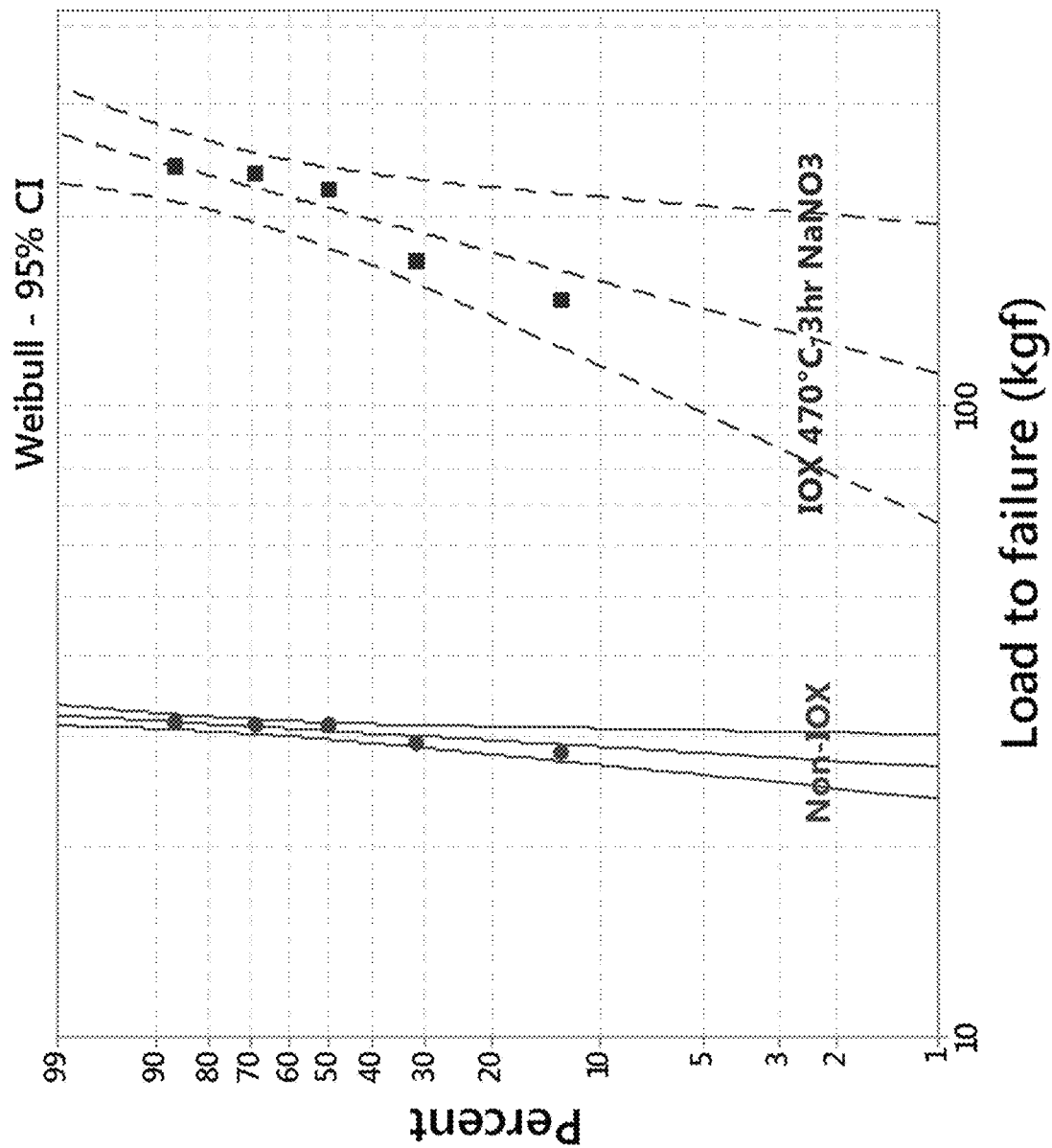
FIG. 13 is a Weibull plot of the ring-on-ring strength of a glass ceramic according to an embodiment before and after ion exchange treatment.

A glass ceramic with a thickness of 0.8 mm and was produced with the composition and ceramming schedule of Sample 1 in Table 1 and then ion exchanged in a $NaNO_3$ bath at a temperature of 470° C. for a time period of 3 hours. The ring-on-ring strength of the sample was measured before and after the ion exchange treatment, as described below. The Weibull plot of the results of the ring-on-ring test is shown in FIG. 13. As shown in FIG. 13, the ion exchange treatment significantly increases the load to failure of the glass ceramic.

The Ring-on-Ring (RoR) test is a surface strength measurement for testing flat glass specimens, and ASTM C1499-09(2013), entitled "Standard Test Method for Monotonic Equibiaxial Flexural Strength of Advanced Ceramics at Ambient Temperature," serves as the basis for the RoR test methodology described herein. The contents of ASTM C1499-09 are incorporated herein by reference in their entirety. Unless otherwise specified, the specimen was not abraded prior to ring-on-ring testing.

Figure 14:
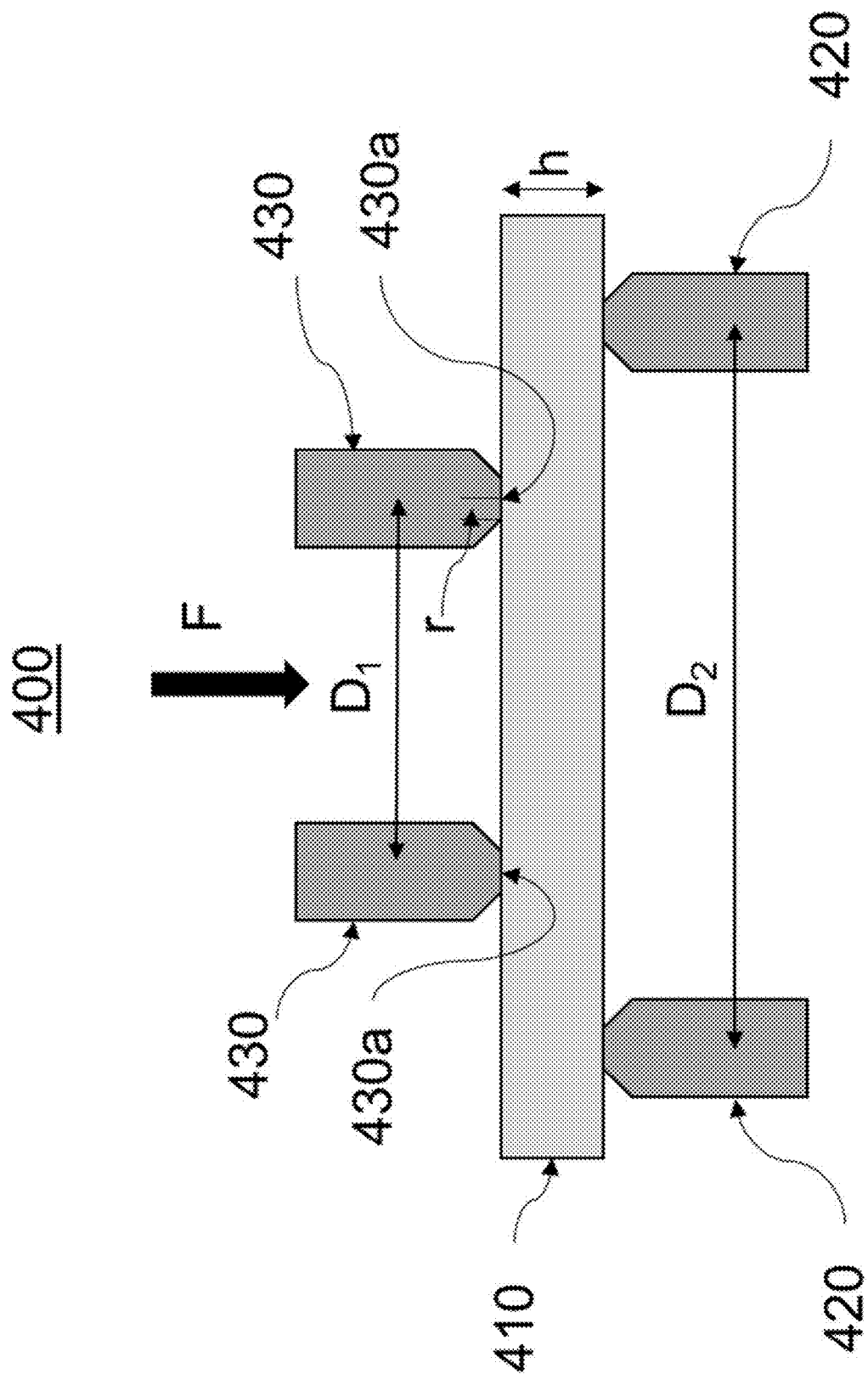
FIG. 14 is a schematic depiction of a ring-on-ring testing apparatus.

For the RoR test, a sample as shown in FIG. 14 is placed between two concentric rings of differing size to determine equibiaxial flexural strength (i.e., the maximum stress that a material is capable of sustaining when subjected to flexure between two concentric rings). In the RoR configuration 400, the glass ceramic article 410 is supported by a support ring 420 having a diameter D2. A force F is applied by a load cell (not shown) to the surface of the glass ceramic article by a loading ring 430 having a diameter D1.

The ratio of diameters of the loading ring and support ring D1/D2 may be in a range from 0.2 to 0.5. In some embodiments, D1/D2 is 0.5. Loading and support rings 130, 120 should be aligned concentrically to within 0.5% of support ring diameter D2. The load cell used for testing should be accurate to within ±1% at any load within a selected range. Testing is carried out at a temperature of 23±2° C. and a relative humidity of 40±10%.

For fixture design, the radius r of the protruding surface of the loading ring 430 is in a range of $h/2 \leq r \leq 3h/2$, where h is the thickness of glass-based article 410. Loading and support rings 430, 420 are made of hardened steel with hardness HRc>40. RoR fixtures are commercially available.

The intended failure mechanism for the RoR test is to observe fracture of the glass ceramic article 410 originating from the surface 430a within the loading ring 430. Failures that occur outside of this region—i.e., between the loading ring 430 and support ring 420—are omitted from data analysis. Due to the thinness and high strength of the glass ceramic article 410, however, large deflections that exceed ½ of the specimen thickness h are sometimes observed. It is therefore not uncommon to observe a high percentage of failures originating from underneath the loading ring 430. Stress cannot be accurately calculated without knowledge of stress development both inside and under the ring (collected via strain gauge analysis) and the origin of failure in each specimen. RoR testing therefore focuses on peak load at failure as the measured response.

The strength of glass-based article depends on the presence of surface flaws. However, the likelihood of a flaw of a given size being present cannot be precisely predicted, as the strength of glass is statistical in nature. A probability distribution can therefore be used as a statistical representation of the data obtained.

Figure 15:
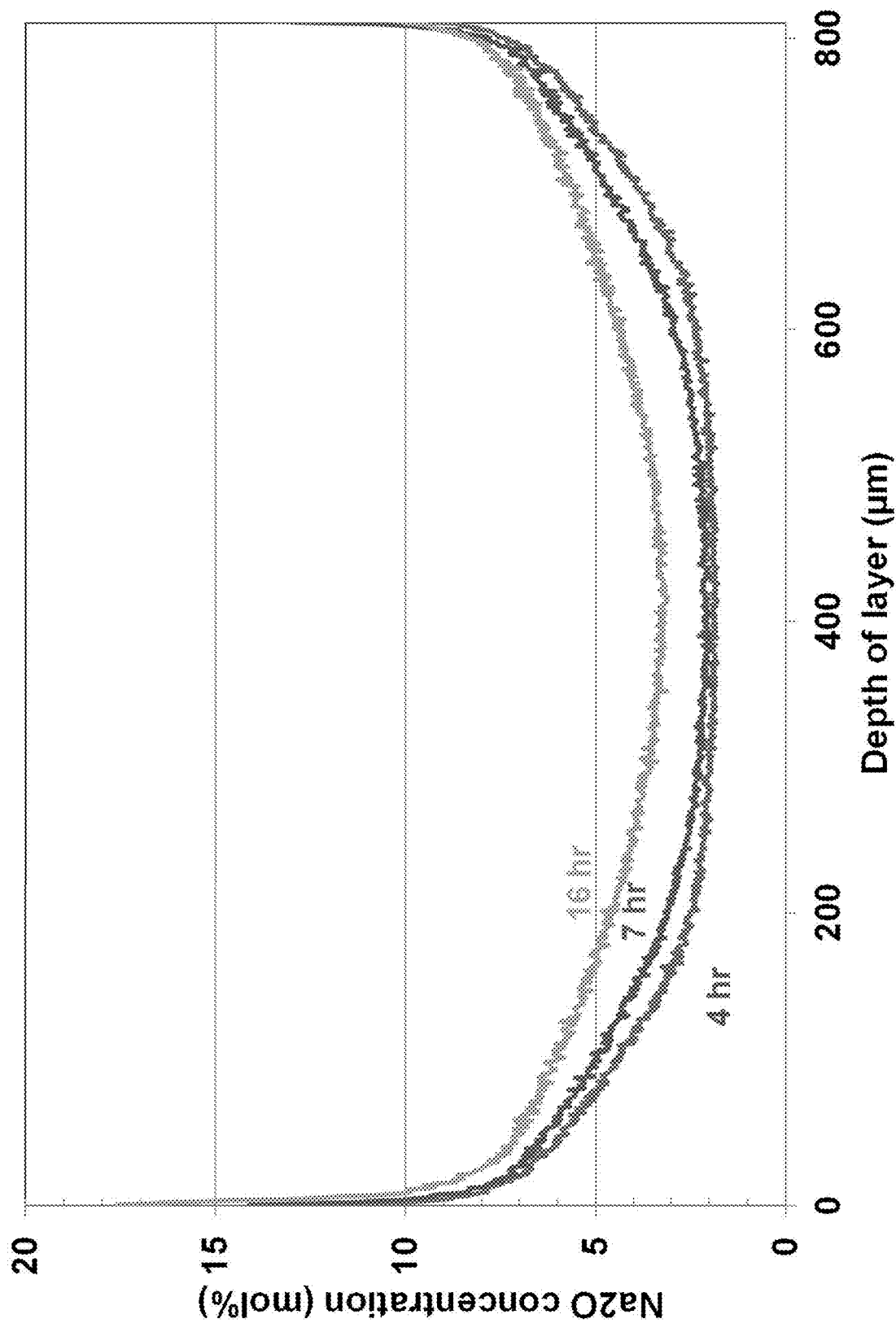
FIG. 15 is a plot of the $Na_2O$ concentration in mol % as measured by electron microprobe as a function of depth below the surface of a glass ceramic according to an embodiment ion exchanged for various times.

Glass ceramics with a thickness of 0.8 mm were produced with the composition and ceramming schedule of Sample 1 in Table 1 and then ion exchanged in a $NaNO_3$ bath at a temperature of 470° C. for time periods of 4 hours, 7 hours, and 16 hours. The concentration of $Na_2O$ in the ion exchanged glass ceramics was then measured with an electron microprobe to determine the $Na_2O$ concentration profile as a function of depth below the surface of the ion exchanged glass ceramics. The measured $Na_2O$ concentration profiles of the ion exchanged glass ceramics are shown in FIG. 15.

Figure 16:
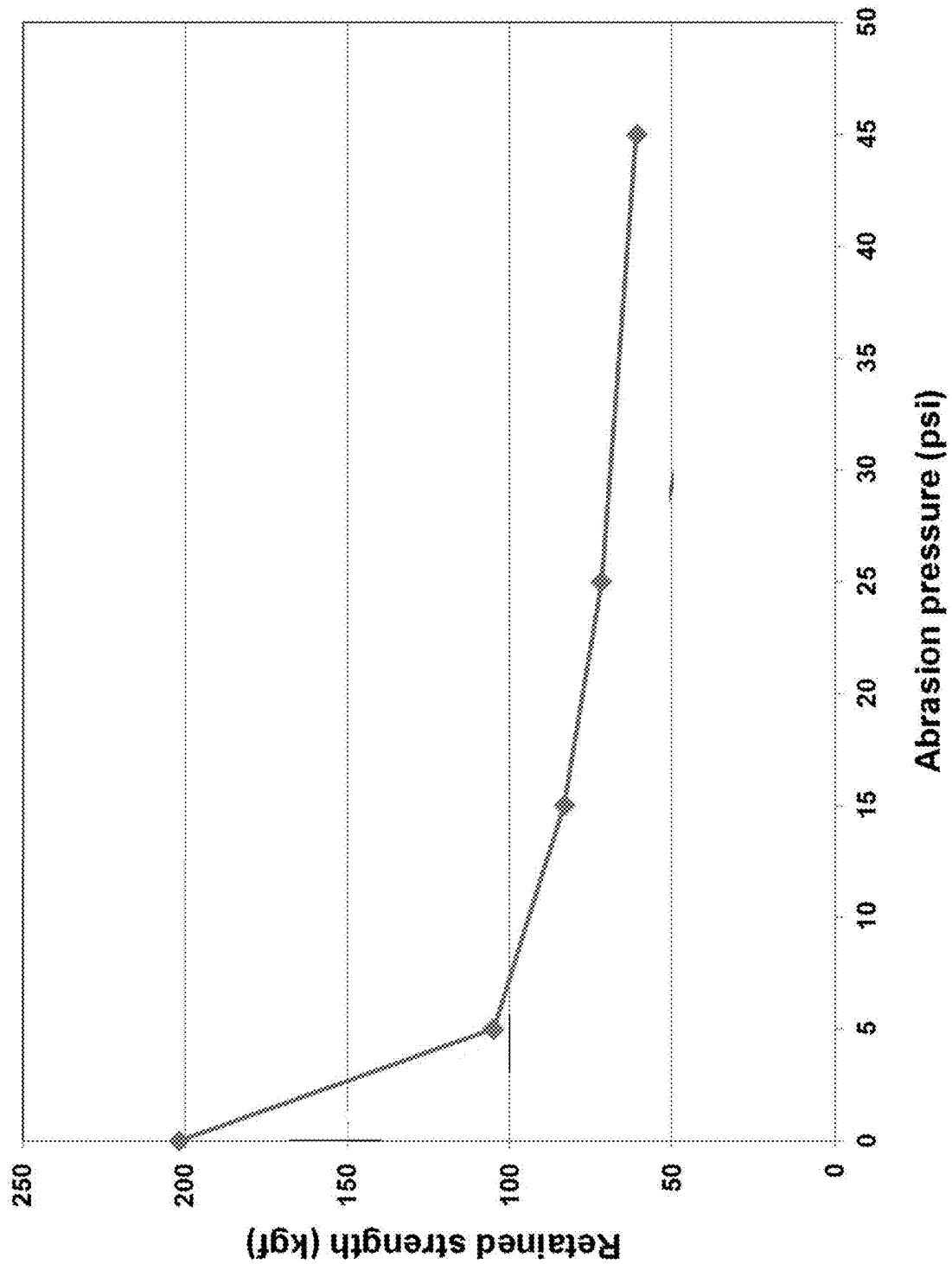
FIG. 16 is a plot of retained strength as a function of abrasion pressure of an ion exchanged glass ceramic according to an embodiment.

A glass ceramic with a thickness of 0.8 mm and was produced with the composition and ceramming schedule of Sample 1 in Table 1 and then ion exchanged in a $NaNO_3$ bath at a temperature of 470° C. for a time period of 3 hours. The ring-on-ring strength of the sample was measured after the ion exchange treatment and after abrasion with abrasive particles at various abrasion pressures for standardized abrasion times. The abrasion pressures employed were 0 psi (not abraded), 5 psi, 15 psi, 25 psi, and 45 psi. The abrasion introduced flaws to the surface of the glass ceramic. The retained strength as measured by load to failure of the abraded ion exchanged glass ceramic articles for the various abrasion pressures in a ring-on-ring test are shown in FIG. 16.

All compositional components, relationships, and ratios described in this specification are provided in wt % unless otherwise stated. All ranges disclosed in this specification include any and all ranges and subranges encompassed by the broadly disclosed ranges whether or not explicitly stated before or after a range is disclosed.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A glass ceramic, comprising:
a first primary crystal phase comprising lithium disilicate;
a second primary crystal phase comprising β-spodumene; and
magnetite as a minor crystal phase,
wherein the glass ceramic is characterized by the following color coordinates:
L*: 15.0 to 35.0;
a*: −3.0 to 3.0; and
b*: −5.0 to 5.0.

2. The glass ceramic of claim 1, wherein the minor crystal phase further comprises β-quartz.

3. The glass ceramic of claim 1, wherein the glass ceramic has a fracture toughness of greater than or equal to 0.9 $MPa·m^{0.5}$ to less than or equal to 2.0 $MPa·m^{0.5}$.

4. A glass ceramic, comprising:
a first primary crystal phase comprising lithium disilicate;
a second primary crystal phase comprising β-spodumene; and
at least one of magnetite, β-quartz, cristobalite, and lithium phosphate as a minor crystal phase,
wherein the glass ceramic is characterized by the following color coordinates:
L*: 15.0 to 35.0;
a*: −3.0 to 3.0; and
b*: −5.0 to 5.0;
wherein the glass ceramic has a fracture toughness of greater than or equal to 1.0 $MPa·m^{0.5}$ to less than or equal to 1.5 $MPa·m^{0.5}$.

5. The glass ceramic of claim 1, wherein a center of the glass ceramic article comprises:
55.0 wt % to 75.0 wt % $SiO_2$;
2.0 wt % to 20.0 wt % $Al_2O_3$;
5.0 wt % to 20.0 wt % $Li_2O$;
greater than 0 wt % to 5.0 wt % $Na_2O$;
0.5 wt % to 5.0 wt % $TiO_2$;
1.0 wt % to 6.0 wt % $P_2O_5$;
0.5 wt % to 10.0 wt % $ZrO_2$;
0.05 wt % to 0.5 wt % $SnO+SnO_2$; and
0.1 wt % to 5.0 wt % $FeO+Fe_2O_3$.

6. The glass ceramic of claim 1, wherein a center of the glass ceramic article comprises:
55.0 wt % to 75.0 wt % $SiO_2$;
2.0 wt % to 20.0 wt % $Al_2O_3$;
0 wt % to 5.0 wt % $B_2O_3$;
5.0 wt % to 20.0 wt % $Li_2O$;
0 wt % to 5.0 wt % $Na_2O$;
0 wt % to 4.0 wt % $K_2O$;
0 wt % to 8.0 wt % $MgO$;
0 wt % to 10.0 wt % $ZnO$;
0.5 wt % to 5.0 wt % $TiO_2$;
1.0 wt % to 6.0 wt % $P_2O_5$;
0.5 wt % to 10.0 wt % $ZrO_2$;
0 wt % to 0.4 wt % $CeO_2$;
0.05 wt % to 0.5 wt % $SnO+SnO_2$;
0.1 wt % to 5.0 wt % $FeO+Fe_2O_3$;
0.1 wt % to 5.0 wt % $NiO$;
0.1 wt % to 5.0 wt % $Co_3O_4$;
0 wt % to 4.0 wt % $MnO+MnO_2+Mn_2O_3$;
0 wt % to 2.0 wt % $Cr_2O_3$;
0 wt % to 2.0 wt % $CuO$; and
0 wt % to 2.0 wt % $V_2O_5$.

7. The glass ceramic of claim 1, wherein the glass ceramic has a crystallinity of greater than 50 wt %.

8. The glass ceramic of claim 1, wherein the glass ceramic is ion exchanged and comprises a compressive stress layer extending from a surface of the glass ceramic to a depth of compression.

9. The glass ceramic of claim 8, wherein the depth of compression is at least 0.05t, where t is a thickness of glass ceramic.

10. The glass ceramic of claim 8, wherein the depth of compression is at least 40 μm.

11. A consumer electronic product, comprising:
a housing comprising a front surface, a back surface and side surfaces;
electrical components at least partially within the housing, the electrical components comprising at least a controller, a memory, and a display, the display at or adjacent the front surface of the housing; and
a cover glass disposed over the display,
wherein at least a portion of the housing comprises the glass ceramic of claim 1.

12. A consumer electronic product, comprising:
a housing comprising a front surface, a back surface and side surfaces;
electrical components at least partially within the housing, the electrical components comprising at least a controller, a memory, and a display, the display at or adjacent the front surface of the housing; and
a cover glass disposed over the display,
wherein at least a portion of the housing comprises the glass ceramic of claim 8.

13. A method, comprising:
ceramming a precursor glass-based article to form a glass ceramic,
wherein the glass ceramic comprises:
a first primary crystal phase comprising lithium disilicate;
a second primary crystal phase comprising β-spodumene; and
magnetite as a minor crystal phase, and
the glass ceramic is characterized by the following color coordinates:
L*: 15.0 to 35.0;
a*: −3.0 to 3.0; and
b*: −5.0 to 5.0.

14. The method of claim 13, wherein the ceramming occurs at a temperature of greater than or equal to 500° C. to less than or equal to 900° C.

15. The method of claim 13, wherein the ceramming occurs for a period of greater than or equal to 4 hours to less than or equal to 16 hours.

16. The method of claim 13, further comprising ion exchanging the glass ceramic.

17. The method of claim 13, wherein the precursor glass-based article comprises:
55.0 wt % to 75.0 wt % $SiO_2$;
2.0 wt % to 20.0 wt % $Al_2O_3$;
5.0 wt % to 20.0 wt % $Li_2O$;
greater than 0 wt % to 5.0 wt % $Na_2O$;
0.5 wt % to 5.0 wt % $TiO_2$;
1.0 wt % to 6.0 wt % $P_2O_5$;
0.5 wt % to 10.0 wt % $ZrO_2$;
0.05 wt % to 0.5 wt % $SnO+SnO_2$; and
0.1 wt % to 5.0 wt % $FeO+Fe_2O_3$.

18. The method of claim 13, wherein the precursor glass-based article comprises:

55.0 wt % to 75.0 wt % $SiO_2$;
2.0 wt % to 20.0 wt % $Al_2O_3$;
0 wt % to 5.0 wt % $B_2O_3$;
5.0 wt % to 20.0 wt % $Li_2O$;
0 wt % to 5.0 wt % $Na_2O$;
0 wt % to 4.0 wt % $K_2O$;
0 wt % to 8.0 wt % $MgO$;
0 wt % to 10.0 wt % $ZnO$;
0.5 wt % to 5.0 wt % $TiO_2$;
1.0 wt % to 6.0 wt % $P_2O_5$;
0.5 wt % to 10.0 wt % $ZrO_2$;
0 wt % to 0.4 wt % $CeO_2$;
0.05 wt % to 0.5 wt % $SnO+SnO_2$;
0.1 wt % to 5.0 wt % $FeO+Fe_2O_3$;
0.1 wt % to 5.0 wt % $NiO$;
0.1 wt % to 5.0 wt % $Co_3O_4$;
0 wt % to 4.0 wt % $MnO+MnO_2+Mn_2O_3$;
0 wt % to 2.0 wt % $Cr_2O_3$;
0 wt % to 2.0 wt % $CuO$; and
0 wt % to 2.0 wt % $V_2O_5$.

\* \* \* \* \*

UNITED STATES PATENT AND TRADEMARK OFFICE
CERTIFICATE OF CORRECTION

| | |
|---|---|
| PATENT NO. | : 11,352,291 B2 |
| APPLICATION NO. | : 16/692250 |
| DATED | : June 7, 2022 |
| INVENTOR(S) | : Carol Ann Click et al. |

It is certified that error appears in the above-identified patent and that said Letters Patent is hereby corrected as shown below:

On the Title Page

On the page 2, in item (56), in Column 2, under "Other Publications", Line 11, delete "Cryst" and insert -- Crystalline --.

On the page 2, in item (56), in Column 2, under "Other Publications", Line 18, delete "Deram" and insert -- Ceram --.

In the Claims

In Column 27, Line 64 (Approx.), in Claim 6, delete "w t%" and insert -- wt % --.

Signed and Sealed this
Eleventh Day of October, 2022

Katherine Kelly Vidal
*Director of the United States Patent and Trademark Office*